United States Patent
Keyrouz et al.

(10) Patent No.: US 10,985,455 B2
(45) Date of Patent: Apr. 20, 2021

(54) EBG STRUCTURE, EBG COMPONENT, AND ANTENNA DEVICE

(71) Applicant: THE ANTENNA COMPANY INTERNATIONAL N.V., Curacao (NL)

(72) Inventors: Shady Keyrouz, Eindhoven (NL); Diego Caratelli, Duizel (NL); Carlos Moreno De Jong van Coevorden, Eindhoven (NL); Jarmos Pirneskoski, Eindhoven (NL); Johan Leo Alfons Gielis, Antwerp (BE)

(73) Assignee: THE ANTENNA COMPANY INTERNATIONAL N.V., Curacao (NL)

(*) Notice: Subject to any disclaimer, the term of this patent is extended or adjusted under 35 U.S.C. 154(b) by 0 days.

(21) Appl. No.: 16/608,076

(22) PCT Filed: Apr. 25, 2018

(86) PCT No.: PCT/NL2018/050268
§ 371 (c)(1),
(2) Date: Oct. 24, 2019

(87) PCT Pub. No.: WO2018/199753
PCT Pub. Date: Nov. 1, 2018

(65) Prior Publication Data
US 2020/0076072 A1 Mar. 5, 2020

(30) Foreign Application Priority Data

Apr. 25, 2017 (NL) .................................... 2018779
Jul. 28, 2017 (NL) .................................... 2019365
(Continued)

(51) Int. Cl.
*H01Q 1/52* (2006.01)
*H01P 1/20* (2006.01)
(Continued)

(52) U.S. Cl.
CPC ........... *H01Q 1/523* (2013.01); *H01P 1/2005* (2013.01); *H01Q 1/48* (2013.01); *H01Q 1/521* (2013.01);
(Continued)

(58) Field of Classification Search
CPC ...... H01P 1/2005; H01Q 1/48; H01Q 15/008; H01Q 1/52; H05K 1/0236; H05K 2001/093; H05K 2001/09609
See application file for complete search history.

(56) References Cited

U.S. PATENT DOCUMENTS 7,620,527 B1 * 11/2009 Gielis .................... G06F 30/00
  703/2
7,629,930 B2 * 12/2009 Murch .................... H01Q 1/48
  343/700 MS
(Continued)

FOREIGN PATENT DOCUMENTS

CN     106299727 A     1/2017
WO     2017/061869 A1  4/2017

OTHER PUBLICATIONS

Zarghooni, Behnam et al., "Supershaped metamaterial unit-cells using the gielis formula", 2015 IEEE International Symposium on Antennas and Propagation & USNC/URSI National Radio Science Meeting, IEEE, Jul. 19, 2015, pp. 458-459.
(Continued)

*Primary Examiner* — Ab Salam Alkassim, Jr.
(74) *Attorney, Agent, or Firm* — Nath, Goldberg & Meyer; Joshua B. Goldberg

(57) ABSTRACT

The invention relates to an improved electromagnetic band gap (EBG) structure. The invention also relates to an elec-
(Continued)

tromagnetic band gap (EBG) component for use in an EBG structure according to the invention. The invention further relates to an antenna device comprising at least one EBG structure according to the invention.

19 Claims, 14 Drawing Sheets

(30) Foreign Application Priority Data

Oct. 25, 2017 (NL) ...................................... 2019798
Dec. 5, 2017 (NL) ...................................... 2020017

(51) Int. Cl.
*H01Q 1/48* (2006.01)
*H05K 1/02* (2006.01)
*H05K 1/11* (2006.01)
*H01Q 15/00* (2006.01)

(52) U.S. Cl.
CPC ......... *H01Q 15/008* (2013.01); *H05K 1/0236* (2013.01); *H05K 1/115* (2013.01); *H05K 2201/093* (2013.01); *H05K 2201/09609* (2013.01)

(56) References Cited

U.S. PATENT DOCUMENTS

| | | | |
|---|---|---|---|
| 10,777,882 B2* | 9/2020 | Cho | G01S 13/931 |
| 2001/0007445 A1 | 7/2001 | Pankinaho | |
| 2004/0056804 A1 | 3/2004 | Kadambi et al. | |
| 2004/0080457 A1 | 4/2004 | Guo et al. | |
| 2004/0085244 A1 | 5/2004 | Kadambi et al. | |
| 2004/0125030 A1 | 7/2004 | Sung et al. | |
| 2004/0263396 A1 | 12/2004 | Sung | |
| 2006/0290572 A1 | 12/2006 | Chan | |
| 2008/0136710 A1* | 6/2008 | Nefedov | H01Q 1/2283 343/700 MS |
| 2009/0051595 A1 | 2/2009 | Wang et al. | |
| 2010/0156739 A1* | 6/2010 | Kwak, II | H01Q 1/245 343/841 |
| 2014/0049437 A1* | 2/2014 | Hung | H01Q 21/28 343/841 |
| 2015/0106069 A1* | 4/2015 | Gielis | G06F 30/20 703/2 |
| 2015/0214630 A1 | 7/2015 | Shimura | |
| 2016/0141748 A1* | 5/2016 | Tagi | H01Q 1/525 342/175 |
| 2016/0141749 A1* | 5/2016 | Tagi | H01Q 1/521 343/872 |
| 2016/0344093 A1* | 11/2016 | Tagi | H01Q 1/38 |
| 2018/0062233 A1* | 3/2018 | Lindsey | H01Q 15/0013 |
| 2018/0277946 A1* | 9/2018 | Murata | H01Q 9/0407 |
| 2019/0131701 A1* | 5/2019 | Watanabe | H01Q 1/523 |
| 2020/0091599 A1* | 3/2020 | Nakamura | H01Q 1/2283 |

OTHER PUBLICATIONS

International Search Report of corresponding PCT/NL2018/050268 dated Jul. 13, 2018 with forms ISA/220, ISA/210, and ISA/237 Written Opinion.
EP Search Report for priority application NL 2019365 dated Apr. 11, 2018, with English translation.
EP Search Report for priority application NL 2020017 dated Mar. 8, 2018, with English translation.

* cited by examiner m = 5
n1 = 1
n2 = 1
n3 = 1
a = 1
b = 1 m = 6
n1 = 1
n2 = 1
n3 = 1
a = 1
b = 1 m = 7
n1 = 1
n2 = 1
n3 = 1
a = 1
b = 1 m = 8
n1 = 1
n2 = 1
n3 = 1
a = 1
b = 1 m = 6
n1 = 0.5
n2 = 1
n3 = 1
a = 1
b = 1 m = 6
n1 = 1
n2 = 1
n3 = 1
a = 1
b = 1 m = 6
n1 = 1.5
n2 = 1
n3 = 1
a = 1
b = 1 m = 6
n1 = 2
n2 = 1
n3 = 1
a = 1
b = 1

EBG STRUCTURE, EBG COMPONENT, AND ANTENNA DEVICE

This is a National Phase Application filed under 35 U.S.C. 371 as a national stage of PCT/NL2018/050268, filed Apr. 25, 2018, an application claiming the benefit of Dutch (NL) Application No. 2018779, filed Apr. 25, 2017, Dutch (NL) Application No. 2019365, filed Jul. 28, 2017, Dutch (NL) Application No. 2019798, filed Oct. 25, 2017, and Dutch (NL) Application No. 2020017, filed Dec. 5, 2017, the content of each of which is hereby incorporated by reference in its entirety.

The invention relates to an Electromagnetic Band Gap (EBG) structure. The invention also relates to an Electromagnetic Band Gap (EBG) component for use in an EBG structure according to the invention. The invention further relates to an antenna device comprising at least one EBG structure according to the invention.

Modern communication wireless devices rely on MIMO (Multiple Input Multiple Output) antenna systems in order to increase the data rate and maximize coverage range. Preserving high isolation between antenna elements is a key requirement to achieve said goals. The trend in product design is to make wireless communication systems as compact as possible. This inherently results in a reduced space and reduced separation between different antennas and, because of that, antenna isolation deteriorates. Polarization and spatial diversity are mainly used for achieving large isolation between antennas. However, these two design techniques have limitations in case of high density and a large number of antennas integrated in a given system.

For preserving high antenna isolation (>30 dB), EBG structures can be placed between the radiating elements. An EBG structure is composed by an ideally infinite periodic assembly of unit cells with certain spectral characteristics optimized in such a way as to prevent the propagation of electromagnetic waves in a specified band of frequency for all incident angles and all polarization states. In real life, EBG structures are truncated. In a planar topology, they may be regarded as high impedance surfaces (HIS) which are capable of suppressing or attenuating surface waves propagating between antennas sharing the same platform or circuit board, this leading to high isolation. Furthermore, EBG structures can enhance the radiation characteristics of antennas, if the relevant design is optimized in a way that the reflected wave contributions interfere constructively with the waves radiated from the individual antenna.

EGB structures are designed for operation in a specific frequency band. The operating band gap depends on the size and geometry of the EBG unit cell. Conventional EBG structures with canonical unit cells (having square, triangular, hexagonal and circular shape) have been used for isolation enhancement between antenna elements in MIMO systems. However, there is a continuous need to further improve the performance of EBG structures.

It is a first object of the invention to provide an improved EBG structure.

It is a second object of the invention to detail a new class of improved EBG structures.

It is a third object of the invention to provide an improved EBG structure, by means of which isolation between antennas can be increased, in particular without compromising the size, the efficiency, the gain, and/or jeopardizing the radiation pattern characteristics of the antennas.

In order to achieve at least one of the aforementioned objects, the invention provides an EBG structure according to claim 1. The mathematical formula cited in claim 1 is also referred to as Gielis' formula. Shapes generated with this formula are generally known as super-shapes. Preferred embodiments of the EBG structure, also referred to as an EBG decoupling structure, are described in the dependent claims. The tiles are also referred to as patches.

To increase isolation between antennas while preserving the size of the end product where said antennas are to be integrated, without compromising efficiency, gain and radiation pattern characteristics of the antennas, a novel EBG structure has been developed and is proposed here. Such EBG structure can enhance antenna isolation by 5 to 10 dB as compared to conventional EBG solutions, while providing an additional isolation improvement of 10 to 20 dB with respect to the same system configuration without EBG de-couplers (FIG. 1b). This is achieved by tiling, at least partially, different super-shaped electrically conductive tiles (FIG. 2a-2c) printed on a multi-layered dielectric substrate. The unit cells are typically placed on the same plane along two coordinate directions (XY) at a suitable (electrically small) distance from each other. The size of the unit cells and the separation between adjacent cells controls the operational frequency band of the EBG structure. For an EBG structure operating in the frequency range between 5.15 GHz and 5.875 GHz, the distance between adjacent cells typically varies from 0.1 to 0.4 millimetre. At least a number of unit cells, and possibly all cells, may have the same shape (design) and the same dimensions. It is, however, conceivable, that super-shaped unit cells with different geometries are combined together, such as complementarily shaped unit cells. The unit cells are preferably realized in a regular pattern onto the dielectric substrate.

In order to enhance the isolation properties of the EBG structure according to the invention, the following strategies can be implemented: firstly, it is possible to increase the dimensions (the length and/or the width and/or the thickness) of the EBG structure. Secondly, the density of unit cells embedded in the structure can be increased. Thirdly, the distance between adjacent unit cells can be reduced, e.g. by using complementarily shaped metal tiles (resulting in a fine tiling of the conductive layer applied onto the individual dielectric layer). Fourthly, the number of dielectric layers, as well as the number of conductive layers can be increased, wherein the number and/or design and/or size of the metal tiles may differ per layer.

Each dielectric layer is typically made of a dielectric (semi-)rigid plate or substrate. Each dielectric layer preferably comprises at least one dielectric base layer selected from the group consisting of: a paper base, a glass fibre cloth base, a composite base (CEM series), a laminated multilayer board base and, a special material base (ceramic, metal core base, etc.). More preferably, the dielectric layer comprises a composite material composed of woven fiberglass cloth with an epoxy resin binder that is flame resistant (self-extinguishing). A suitable example of this woven glass fibre cloth based material is FR4. The operating frequency band of the EBG structure is typically directly correlated to the thickness of the dielectric layer, in and in particular the overall thickness of the laminate of layers, said laminate also being referred to as a substrate. For an EBG structure operating in the frequency range from 5.15 GHz to 5.875 GHz, the substrate thickness is preferably between 2 mm and 5 mm, and is more preferably selected to be about 3 mm.

Each conductive tile forming, constituting, and/or making part of aEBG (unit) cell is commonly made of metal, preferably copper. However, other metals, like e.g. tin, aluminium, gold, palladium, zinc, cadmium, lead, chromium, nickel, silver and manganese may also be used.

Commonly, though not necessarily, all unit cells are made out of the same material. Typically, each cell is physically connected by means of a conductive pin, also referred to as a "via", directly or indirectly to the ground plane. In case the EBG structure comprises a plurality of dielectric layers and a plurality of conductive layers, wherein each conductive layer is applied onto a dielectric layer and comprises a pattern of super-shaped tiles. Preferably, tiles positioned on the top of each other are mutually physically connected by means of pins (vias), wherein the tile positioned closest to the ground plane is physically connected to the ground plane by means of a pin (via). The assembly of tiles stacked on top of each other, wherein the tiles are mutually connected by means of a via, is also referred to as a EBG unit cell. Here, the EBG unit cell may comprise dielectric material positioned in between (each) two tiles stacked onto each other. Each pin (via) extends along a through-hole made in a dielectric layer, and preferably each dielectric layer. Each pin (via) preferably extends along a through-hole made in the dielectric laminate (substrate). The diameter of the pin (via) can also be used to fine tune the frequency response of the EBG structure. For an EBG structure operating in the frequency range from 5.15 GHz to 5.875 GHz, the typical diameter of each pin (via) and each through-hole is selected to be between 0.25 and 1.0 mm, and is preferably set equal to about 0.9 mm.

As already indicated above, the radio-frequency characteristics and effectiveness of the EBG structure can greatly be enhanced by using complementary tiling of super-shaped tiles. In this way, the EBG structure according to the invention, and consequently an antenna system wherein one or more of said EBG structures are used and/or integrated, can be made smaller (more compact). The EBG structure can have various geometries, such as a (rectangular) strip, a cube, a ring, an angular shape or any other imaginable shape. The EBG structure may also have a more complicated shape, and may e.g. comprises multiple EBG structure segments which are mutually connected and which mutually enclose an angle.

The ground plane is commonly formed of a thin sheet or plate, typically with a thickness of less than 1 mm. The shape and dimensions of (a top view of) the ground plane may be identical to the shape and dimensions of (a top view of) the (lowest) dielectric layer to which the ground plane is connected. The ground plane and/or at least one dielectric layer preferably has a base profile defined by the polar function:

$$\rho_d(\varphi) = \frac{1}{\sqrt[n_1]{\left|\frac{1}{a}\cos\frac{m_1}{4}\varphi\right|^{n_2} + / - \left|\frac{1}{b}\sin\frac{m_2}{4}\varphi\right|^{n_3}}}$$

$$a, b \in \mathbb{R}^+; m_1, m_2, n_1, n_2, n_3 \in \mathbb{R}, a, b, n_1 \neq 0$$

wherein:

$\rho_d(\varphi)$ is a curve located in the XY-plane; and $\varphi \in [0, 2\pi)$ is the angular coordinate.

In a preferred embodiment the dielectric layer and/or the ground plane has at least one base profile, which is substantially supershaped, wherein m≥4. This parameter condition leads to unconventional symmetric shape of the dielectric layer and/or ground plane including sharp edges. A further preferred boundary condition is that a≠b, and preferably that at least one value of n1, n2, and n3 deviates from 2. Also these boundary conditions lead to an unconventionally shaped dielectric layer and/or ground plane.

The dielectric layer(s) and/or ground plane can either be flat or non-planar, such as curved and/or segmented.

In a preferred embodiment, the EBG structure comprises: a shared (or common) ground plane, and a plurality of distant EBG components disposed on said shared ground plane, wherein each EBG component comprises: at least one dielectric layer, and a plurality of conductive tiles disposed on each dielectric layer and electromagnetically coupled to the shared ground plane, wherein at least a number of tiles has a base profile defined by the polar function:

$$\rho_d(\varphi) = \frac{1}{\sqrt[n_1]{\left|\frac{1}{a}\cos\frac{m_1}{4}\varphi\right|^{n_2} + / - \left|\frac{1}{b}\sin\frac{m_2}{4}\varphi\right|^{n_3}}}$$

$$a, b \in \mathbb{R}^+; m_1, m_2, n_1, n_2, n_3 \in \mathbb{R}, a, b, n_1 \neq 0$$

wherein:

$\rho_d(\varphi)$ is a curve located in the XY-plane; and $\varphi \in [0, 2\pi)$ is the angular coordinate.

Example of applications of the proposed class of EBG structures according to the invention include fencing for isolation enhancement in MIMO antenna systems. The EBG structure is configured to operate in various regions of the electromagnetic spectrum, such as radio waves, microwaves, millimetre waves, Terahertz frequencies and visible light as well as, typically, the Wi-Fi bands (2.4 GHz/5 GHz). The invention also relates to a EBG component, in particular a metal tile and/or a ground plane and/or a dielectric layer, for use in an EBG structure according to the invention. Preferably, said EBG component comprises at least one dielectric layer configured to be disposed on a ground plane; and a plurality of conductive (metal) tiles disposed on each dielectric layer and configured to be electrically connected to the ground plane, wherein at least a number of (metal) tiles has a base profile defined by the polar function:

$$\rho_d(\varphi) = \frac{1}{\sqrt[n_1]{\left|\frac{1}{a}\cos\frac{m_1}{4}\varphi\right|^{n_2} + / - \left|\frac{1}{b}\sin\frac{m_2}{4}\varphi\right|^{n_3}}}$$

$$a, b \in \mathbb{R}^+; m_1, m_2, n_1, n_2, n_3 \in \mathbb{R}, a, b, n_1 \neq 0$$

wherein:

$\rho_d(\varphi)$ is a curve located in the XY-plane; and $\varphi \in [0, 2\pi)$ is the angular coordinate.

The invention further relates to an antenna device comprising: at least one EBG structure, in particular according to the invention, said EBG structure comprising: a ground plane (also referred to as ground substrate), and at least one EBG component disposed on said ground plane, wherein each EBG component comprises: at least one dielectric layer, and a plurality of conductive tiles disposed on each dielectric layer and electrically connected to the shared ground plane, wherein at least a number of tiles has a base profile defined by the polar function:

$$\rho_d(\varphi) = \cfrac{1}{\sqrt[n_1]{\left|\cfrac{1}{a}\cos\cfrac{m_1}{4}\varphi\right|^{n_2} + \Big/ -\left|\cfrac{1}{b}\sin\cfrac{m_2}{4}\varphi\right|^{n_3}}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane; and
$\varphi \in [0, 2\pi)$ is the angular coordinate
wherein the antenna device further comprises a plurality of antenna units, wherein the ground plane of the EBG structure serves as ground plane for at least one antenna unit, and wherein at least one EBG component is positioned in between two antenna units. The antenna units may be identical antenna units, although it is imaginable that at least two different types of antenna units are used in the antenna device.

Further, the parametric representation of the three-dimensional shape of at least a number of tiles, in particular tiles disposed on an upper dielectric layer, may be based on two perpendicular cross sections $\rho_1(\varepsilon)$ and $\rho_2(\varphi)$:

$$\begin{bmatrix} x = \rho_1(\vartheta)\cos\vartheta \cdot \rho_2(\varphi)\cos\varphi \\ y = \rho_1(\vartheta)\sin\vartheta \cdot \rho_2(\varphi)\cos\varphi \\ z = \rho_2(\varphi)\sin\varphi \end{bmatrix}$$

where $0 \leq \varepsilon \leq 2\pi$, $-\frac{1}{2}\pi \leq \varphi \leq \frac{1}{2}\pi$, and $\rho$ is given by:

$$\rho_d(\varphi) = \cfrac{1}{\sqrt[n_1]{\left|\cfrac{1}{a}\cos\cfrac{m_1}{4}\varphi\right|^{n_2} + \Big/ -\left|\cfrac{1}{b}\sin\cfrac{m_2}{4}\varphi\right|^{n_3}}}$$

$a, b \in \mathbb{R}^+; m_1, m_2, n_1, n_2, n_3 \in \mathbb{R}, a, b, n_1 \neq 0$ Preferably, at least one antenna unit used in the antenna device according to the invention is formed by a dual-band antenna unit, wherein the outside of the antenna unit is of a multi-faced design which is supported by a support body that is designed to be mounted onto the ground plane of the antenna device, wherein the outside of the component includes the following faces: a top face which is provided with an electrically conductive flare layer that encloses at least one flare slot; one or two side faces adjacent to the top face that are provided with an electrically conductive feed strip and an electrically conductive ground strip which strips are both electrically connected to the flare layer; a bottom face that is not adjacent to the top face, which is designed to be mounted onto the ground plane; wherein the ground strip is electrically connectable to the ground plane onto which the component is to be mounted, and wherein the feed strip is electrically connectable to an appropriate RF chain. Preferably, the dual-band antenna is operable in the frequency ranges of 2.4-2.5 GHz and 4.9-6.0 GHz. A more detailed description of further this dual-band antenna unit is described in the non-prepublished Dutch patent application NL2019365, the subject-matter of which patent application is hereby incorporated by reference.

Preferably, at least one (other) antenna unit used in the antenna device according to the invention is formed by a dual-port antenna unit, also referred to as a dual antenna. The dual-port antenna is in fact an antenna assembly, wherein at least two different antennas are combined and, preferably, integrated. More in particular, the dual-port antenna comprises at least one slot antenna and at least one dipole antenna. The dual-port antenna preferably comprises:
at least one slot antenna, comprising:
a first dielectric substrate,
a first conductive ground plane provided with at least one, preferably I-shaped, slot attached to a first side of the first dielectric substrate, and
at least one first probing structure connected to a second side, opposite to the first side, of the dielectric substrate; and
at least one dipole antenna, comprising:
second dielectric substrate,
at least two conductive patches (or arms) applied onto a first side of the second dielectric substrate, wherein the patches (or arms) are positioned at a distance from each other,
at least one second probing structure connected to said patches (or arms), and
at least one second ground plane positioned at a distance from said second dielectric substrate, wherein the second ground plane faces a second side, opposite to the first side, of the second dielectric substrate;
and wherein the at least one slot antenna is positioned in between the second dielectric substrate and the second ground plane, such that the second dielectric substrate and the second ground plane engage with opposite side edges of the at least one slot antenna. Hence, the slot antenna acts as distance holder for spacing the second ground plane and the second dielectric substrate apart. To stabilize this antenna assembly, it is preferred to apply one or more further dielectric distance holders, e.g. plastic pins, wherein each further distance holder co-acts with both the second dielectric substrate and the second ground plane. Preferably, the second dielectric substrate and the second ground plane are oriented substantially parallel. More preferably, the second dielectric substrate and the second ground plane are oriented substantially perpendicular with respect to the first dielectric substrate. This will commonly improve the isolation between both antennas (less interference). The patches (arms), also referred to as flares, preferably have a base profile defined by the polar function:

$$\rho_d(\varphi) = \cfrac{1}{\sqrt[n_1]{\left|\cfrac{1}{a}\cos\cfrac{m_1}{4}\varphi\right|^{n_2} + \Big/ -\left|\cfrac{1}{b}\sin\cfrac{m_2}{4}\varphi\right|^{n_3}}}$$

$a, b \in \mathbb{R}^+; m_1, m_2, n_1, n_2, n_3 \in \mathbb{R}, a, b, n_1 \neq 0$ wherein:
$\rho d(q)$ is a curve located in the XY-plane; and
$\varphi \in [0, 2\pi)$ is the angular coordinate.
Hence, the patches (dipole antenna arms) preferably have a supershaped base profile.

Preferably, one side edge of the slot antenna is positioned substantially in between the patches (dipole antenna arms). This will commonly (also) improve the isolation between both antennas (less interference). Commonly, this dual-port antenna is configured for use in a single frequency band, such as 5 Ghz. The dipole antenna and the slot antenna can be activated selectively and independent of each other. To this end, an electronic switch can be applied. It is imaginable that the dipole antenna and the slot antenna operate simultaneously. Typically, the slot antenna has a quasi-omnidirectional radiation pattern (with respect to the plane of the slot antenna). This makes the slot antenna ideally suitable to be activated when mounted onto a ceiling. The dipole antenna has a broadside radiation pattern, which makes this antenna ideally suitable to be used when mounted to a wall. The second dielectric substrate is preferably configured to attach the dual-port antenna to a supporting structure, such as the ground plane or another substrate of the antenna device. To this end, the second dielectric substrate may be provided with fastening holes. The dual-port antenna described above, and in the figure's description below can be produced and marketed separately, and may therefore be regarded as separate invention (apart from the EBG structure).

The invention will be elucidated on the basis of non-limitative exemplary embodiments shown in the enclosed figures. Herein:

FIG. 1b shows a graph of the isolation enhancement which can be achieved by the antenna device of FIG. 1a;

Figure 2A:
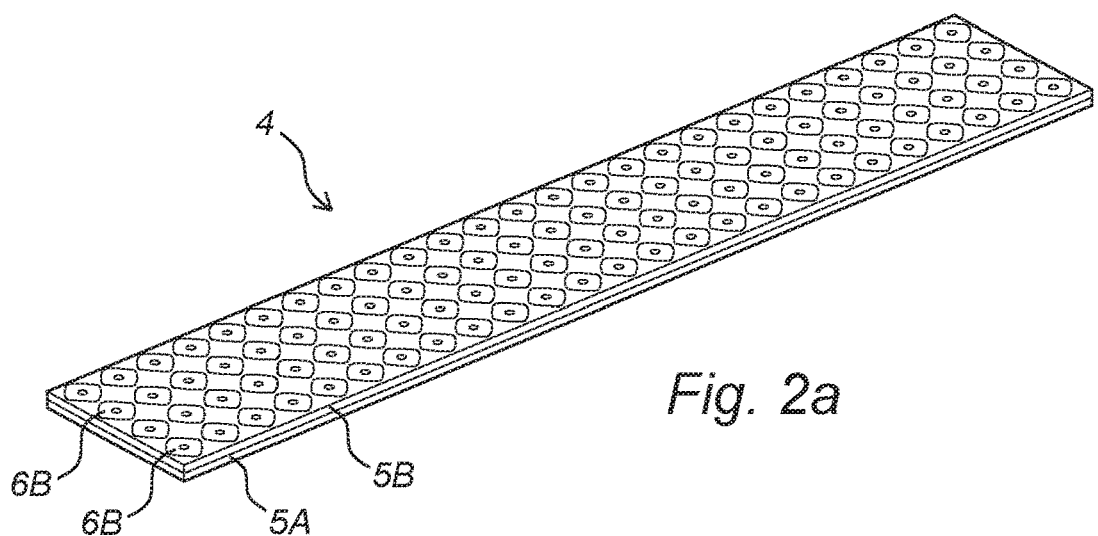
Figure 2B:
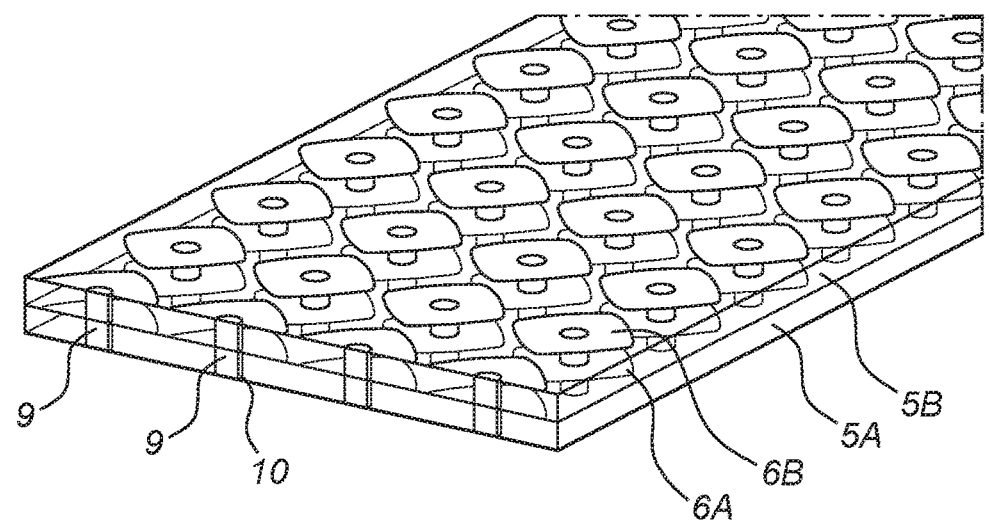
Figure 2C:
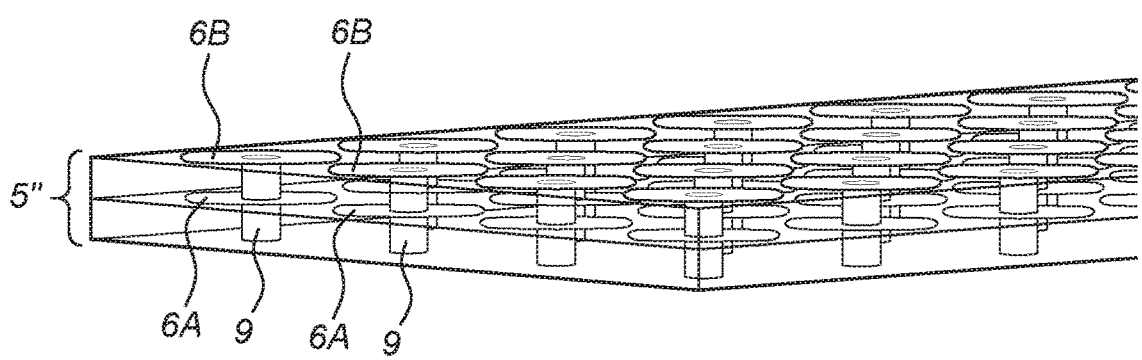
Figure 3A:
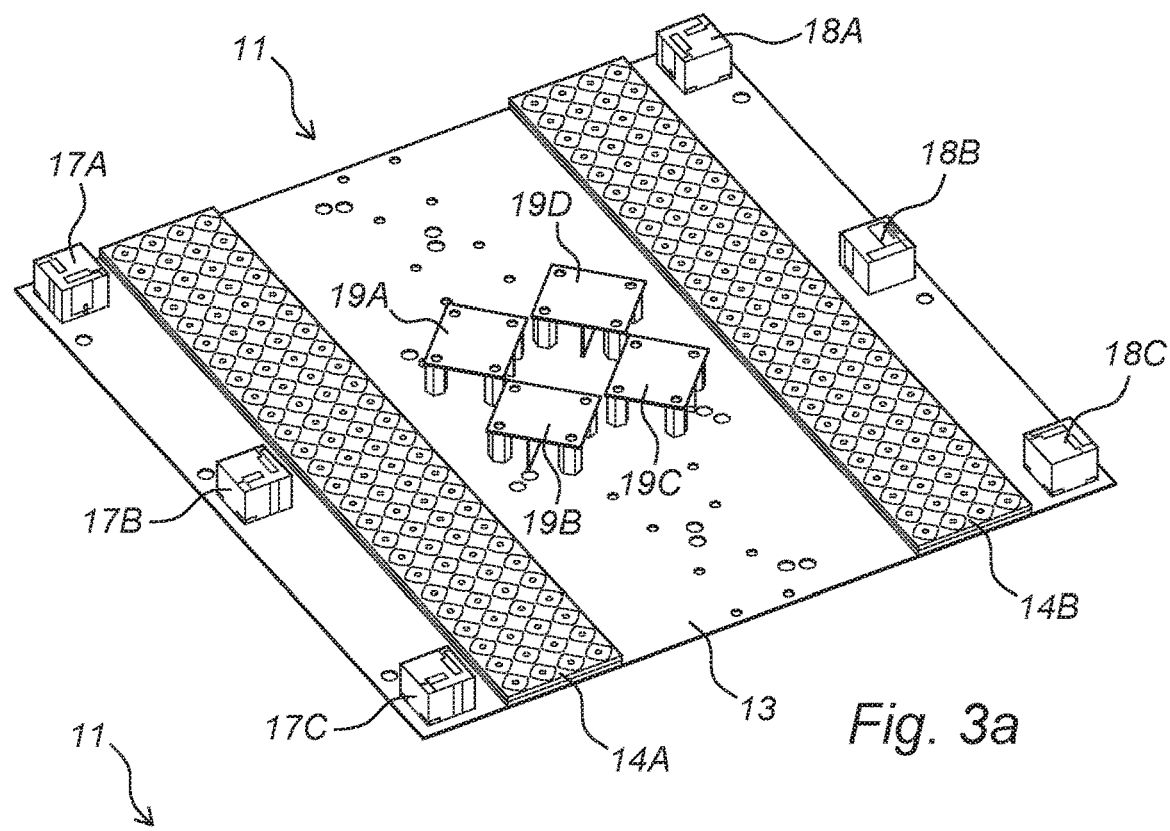
Figure 3B:
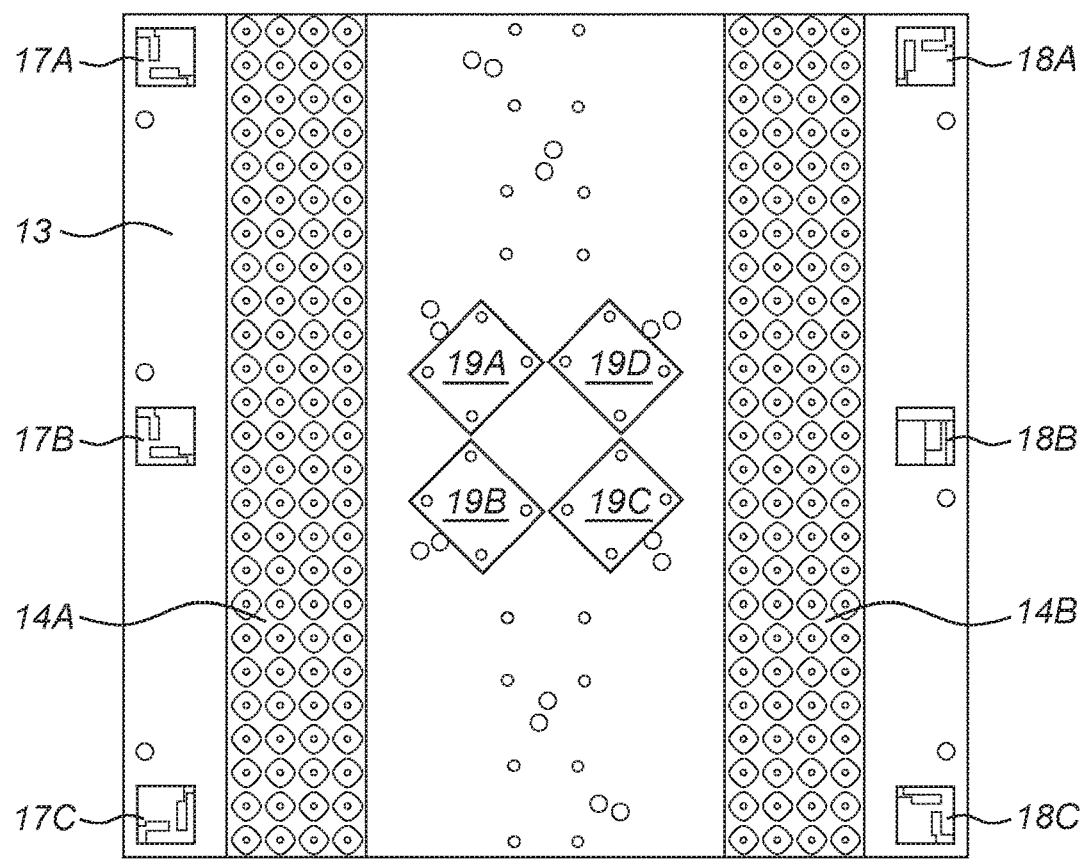
Figure 4:
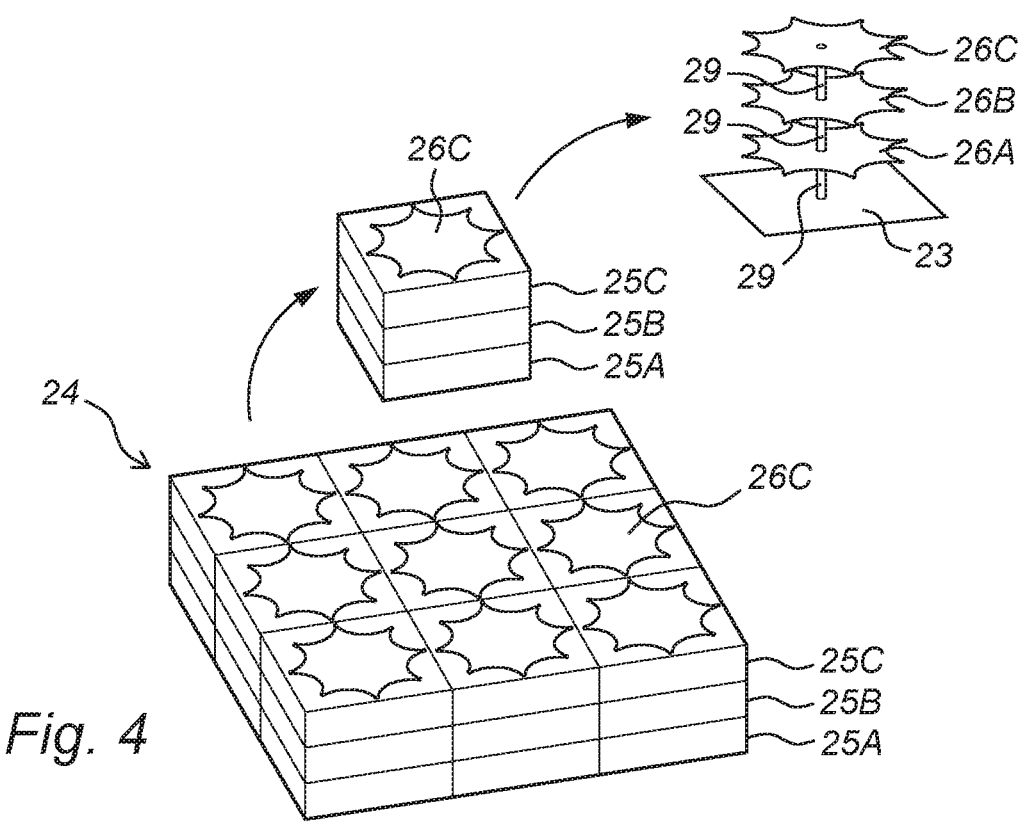
Figure 5:
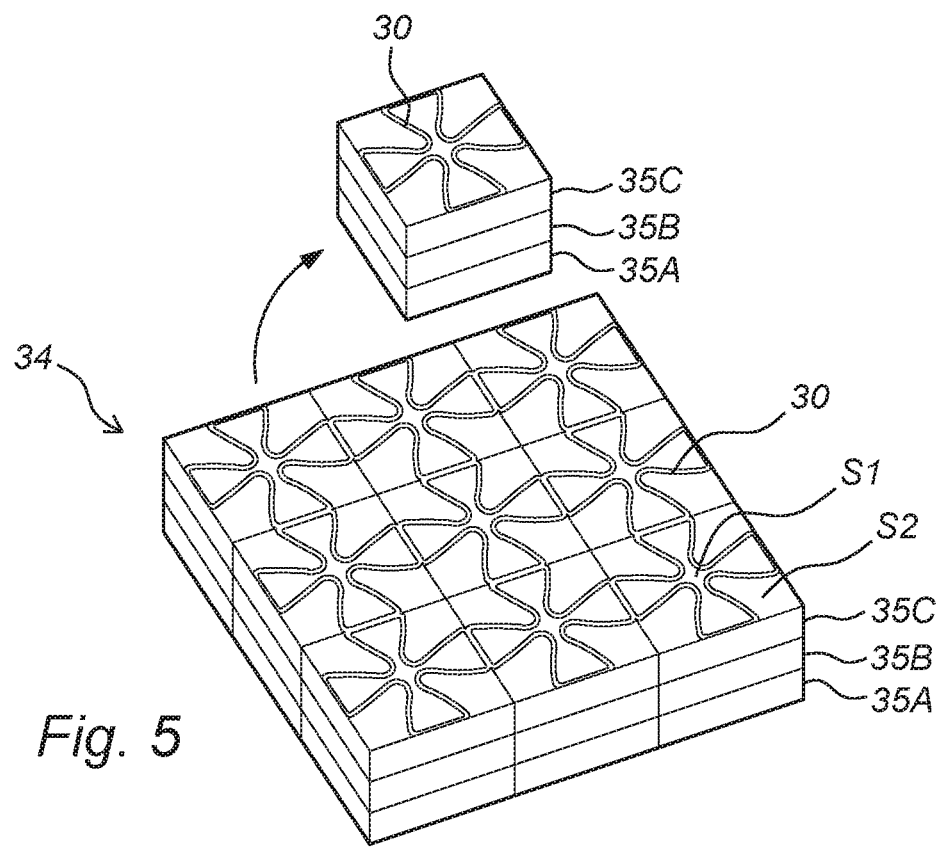
Figure 6:
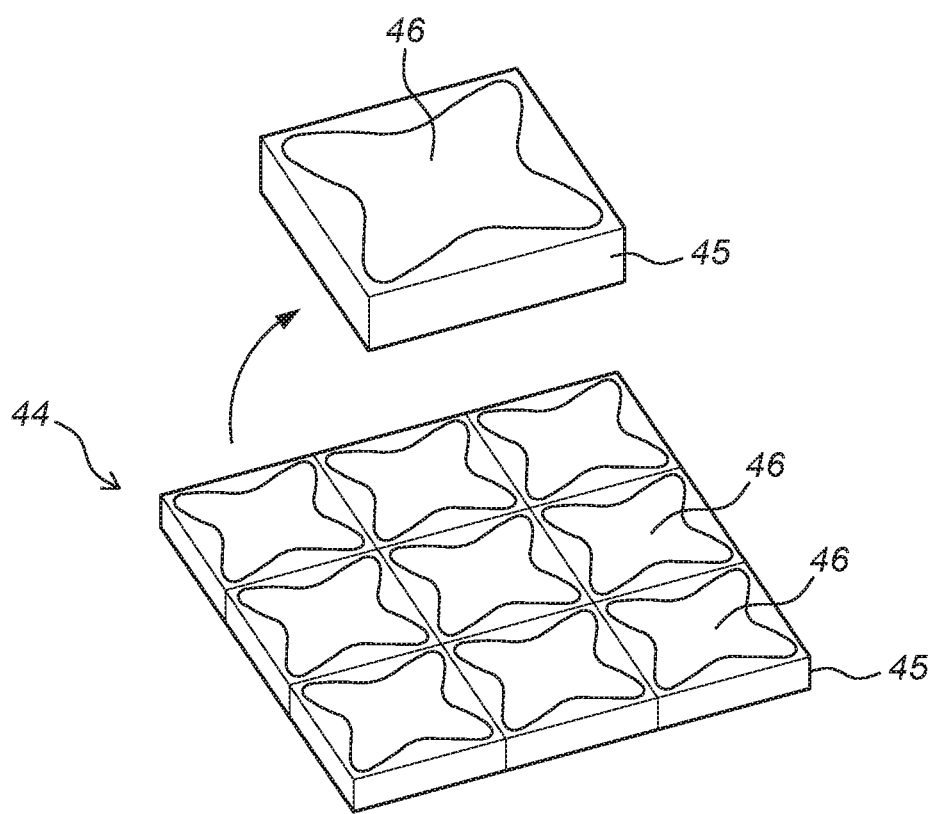
Figure 7A:
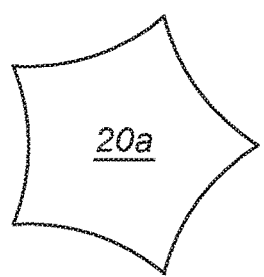
Figure 7B:
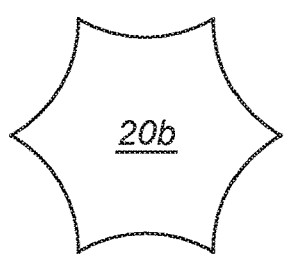
Figure 7C:
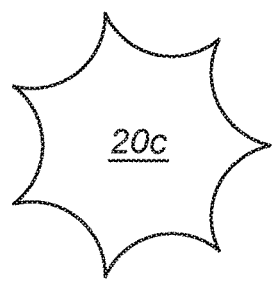
Figure 7D:
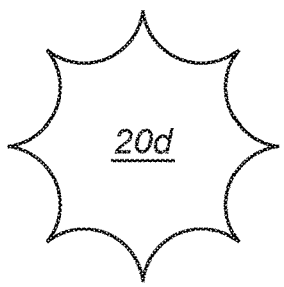
Figure 7E:
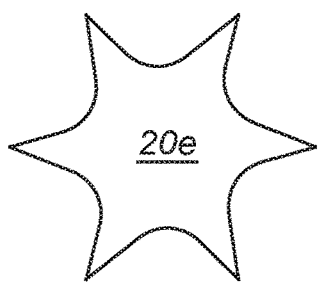
Figure 7F:
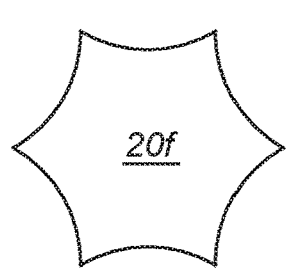
Figure 7G:
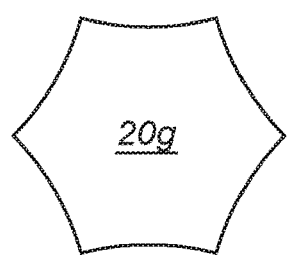
Figure 7H:
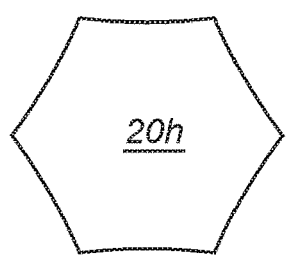
Figure 8:
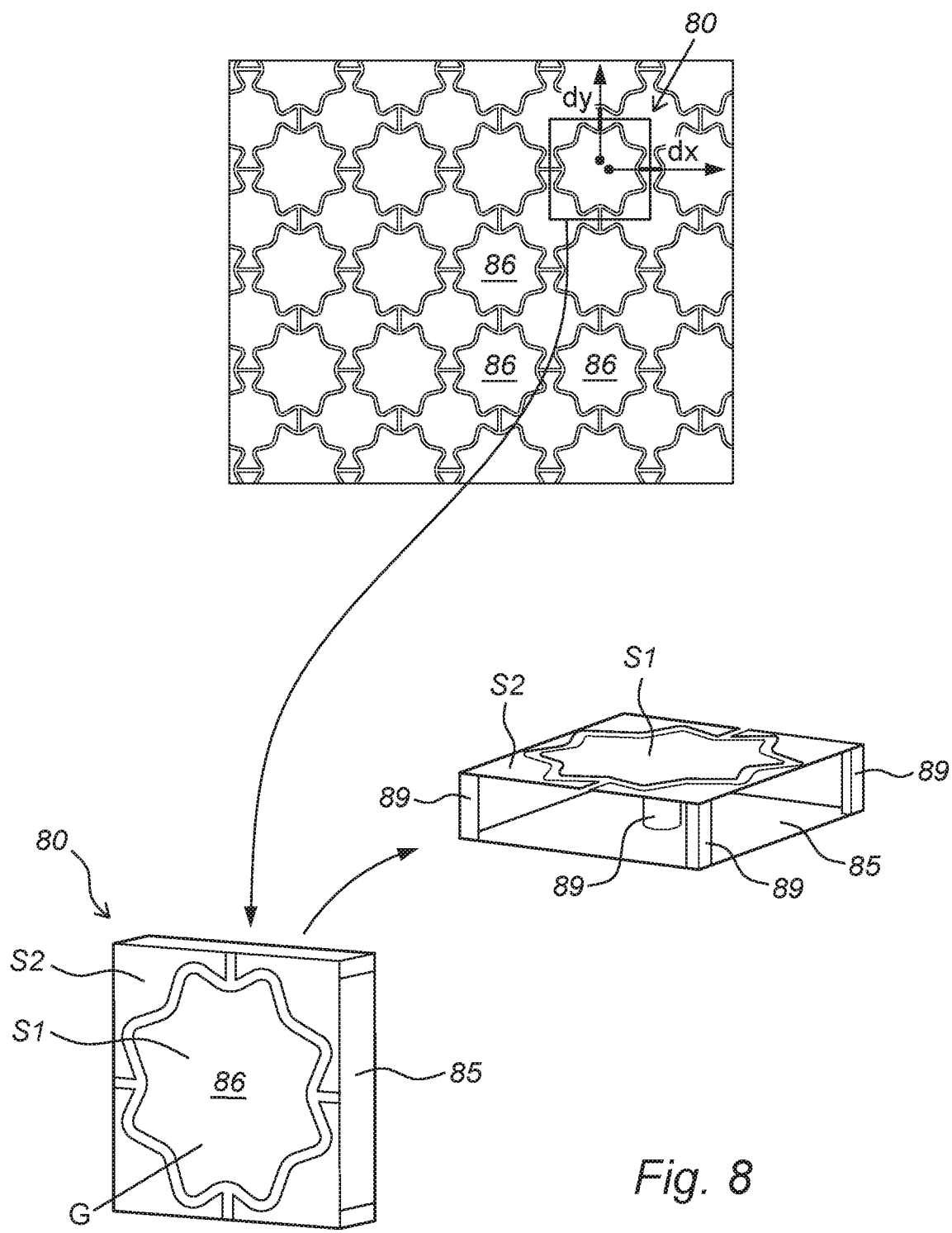
Figure 9A:
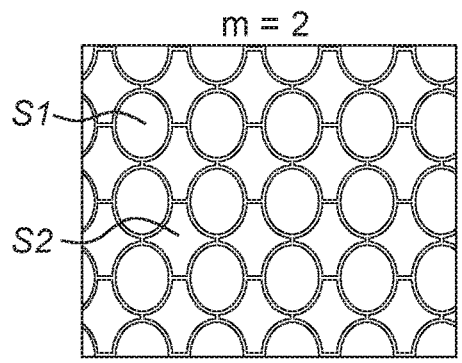
Figure 9B:
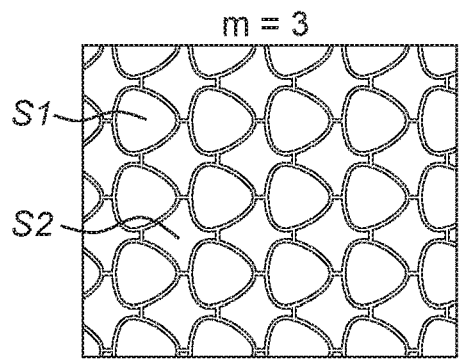
Figure 9C:
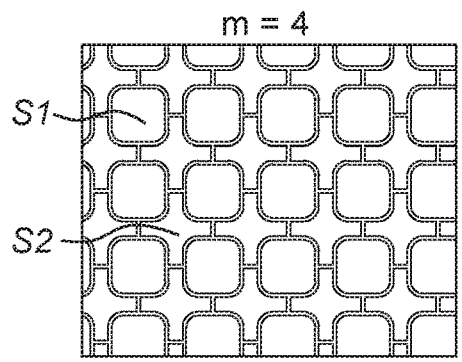
Figure 9D:
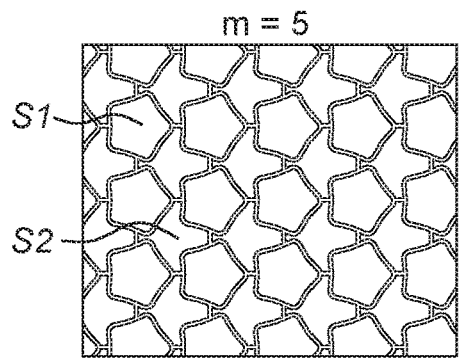
Figure 9E:
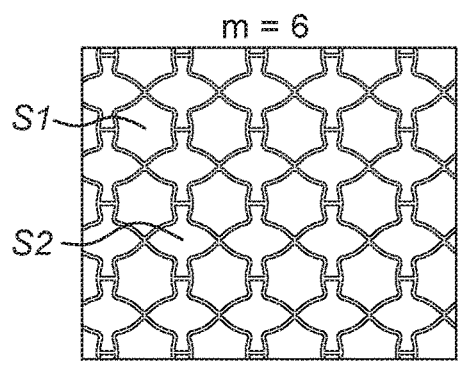
Figure 9F:
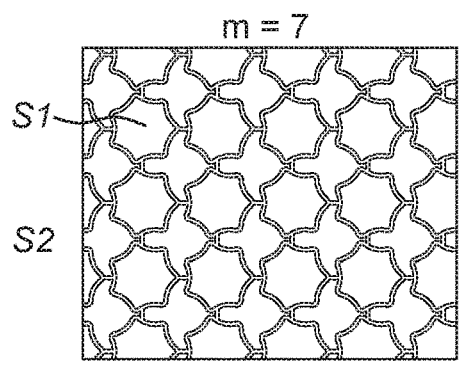
Figure 9G:
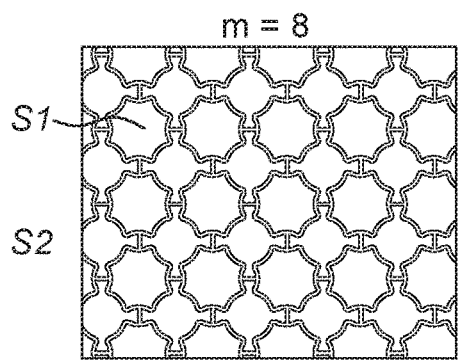
Figure 9H:
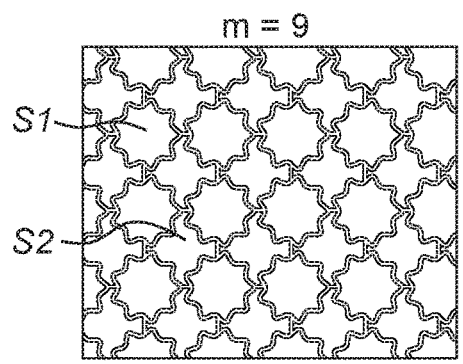
Figure 10:
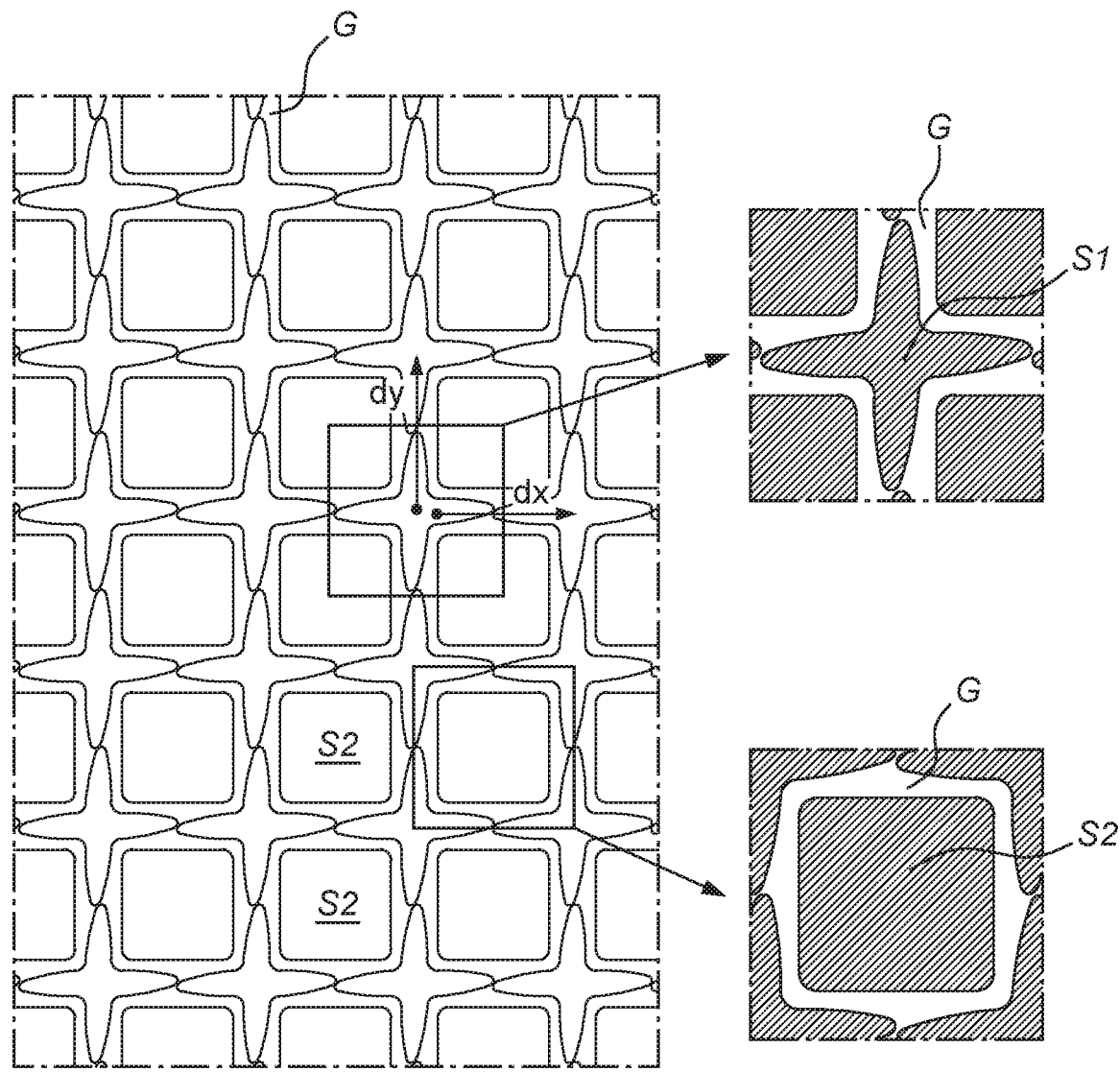
Figure 11:
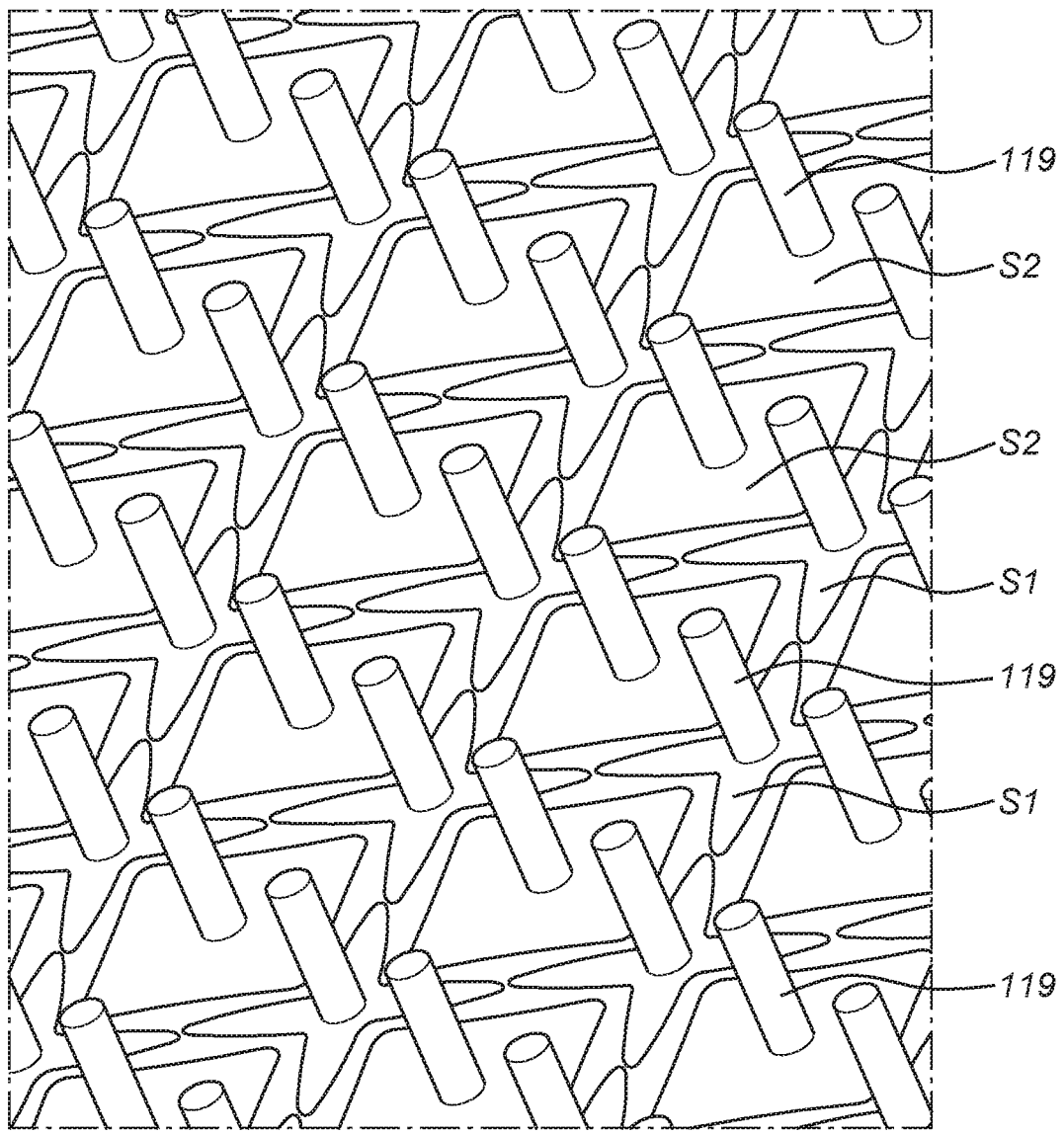
Figure 12A:
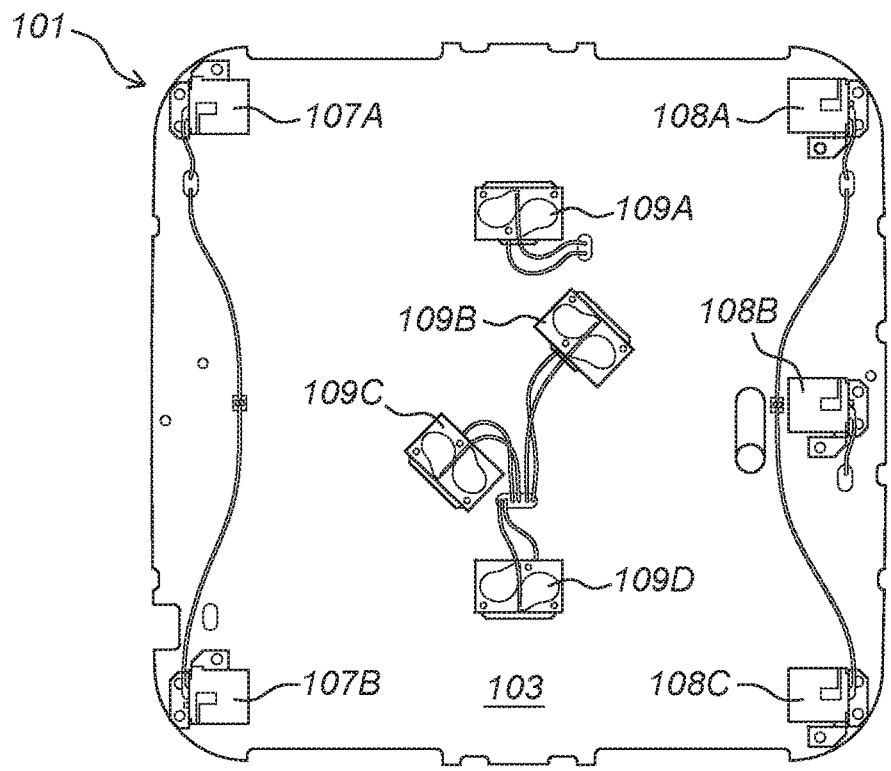
Figure 12B:
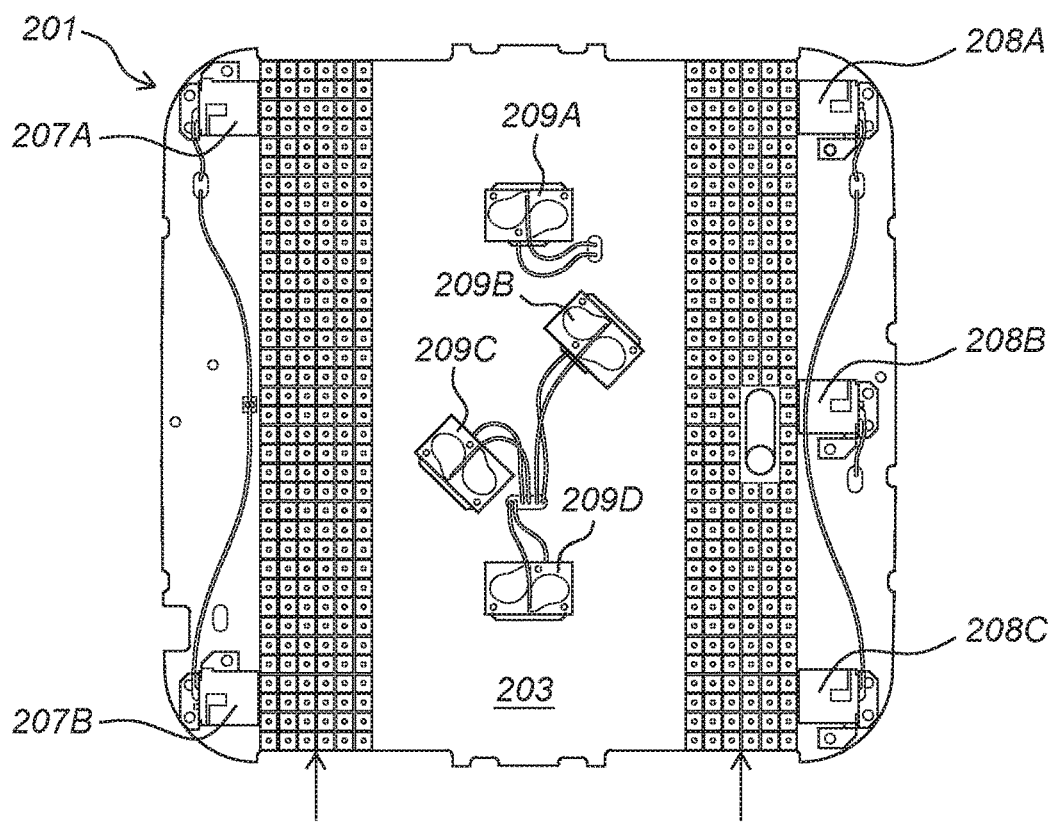
Figure 12C:
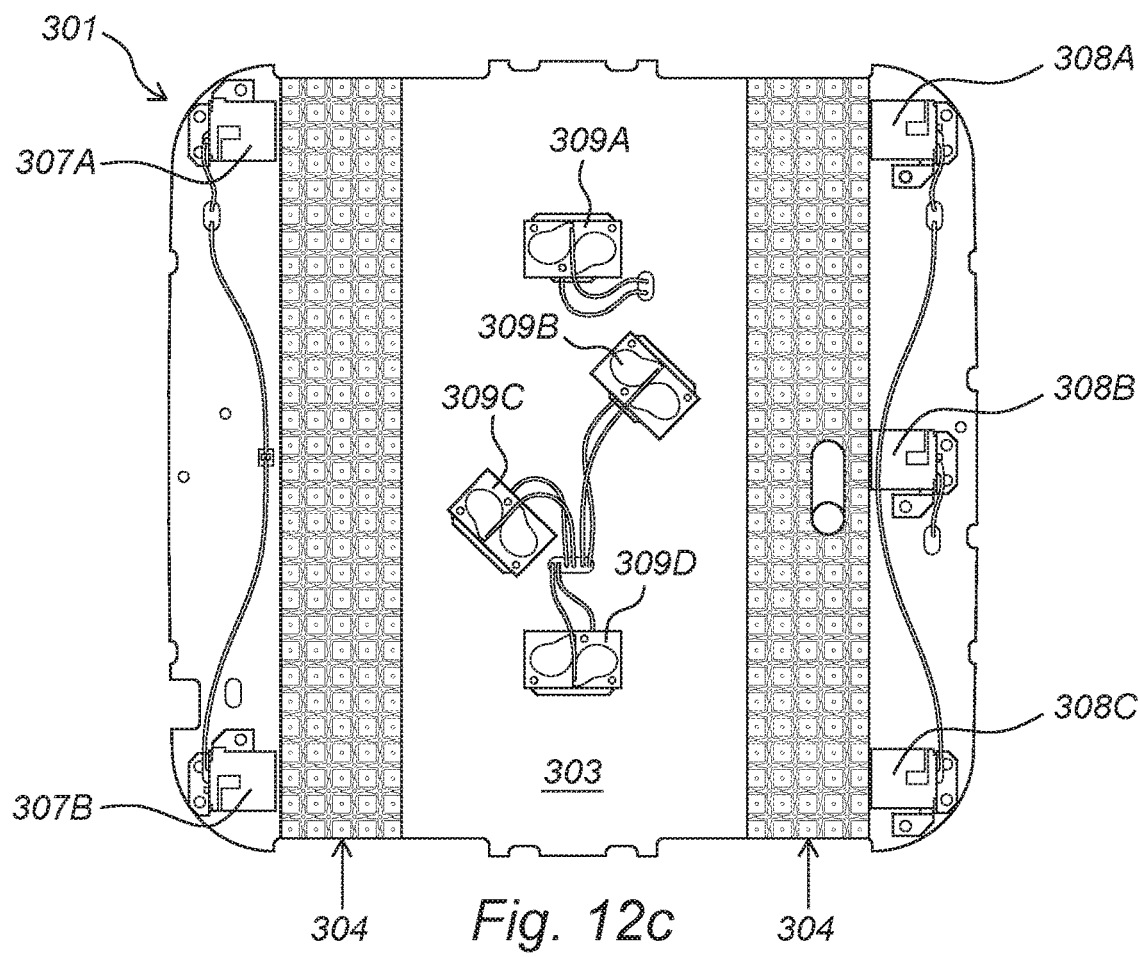
Figure 12D:
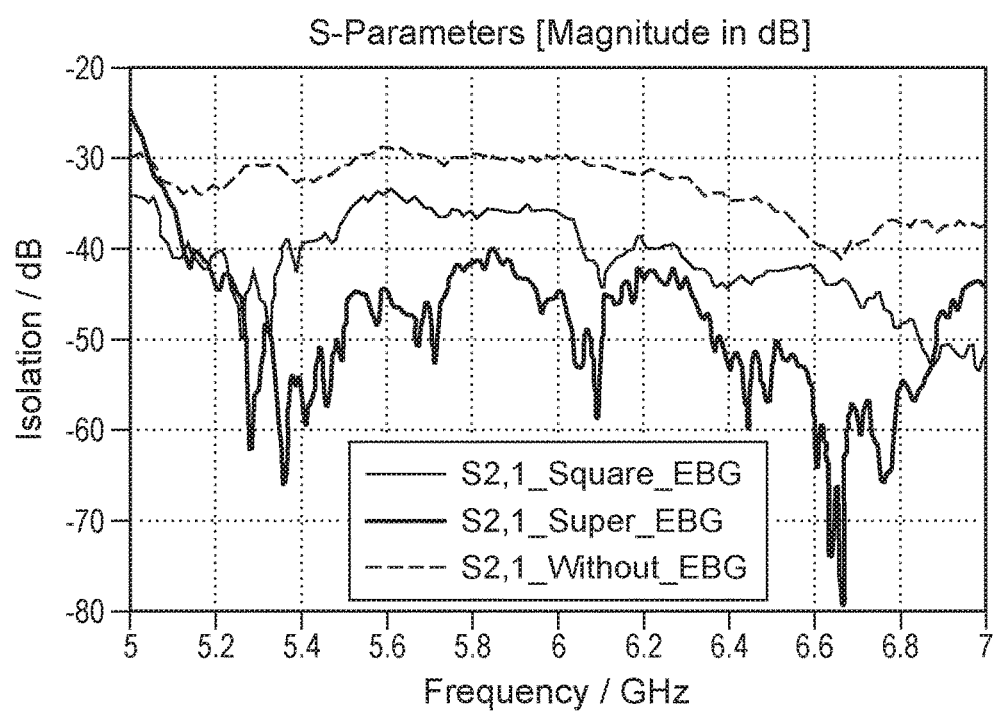
Figure 13A:
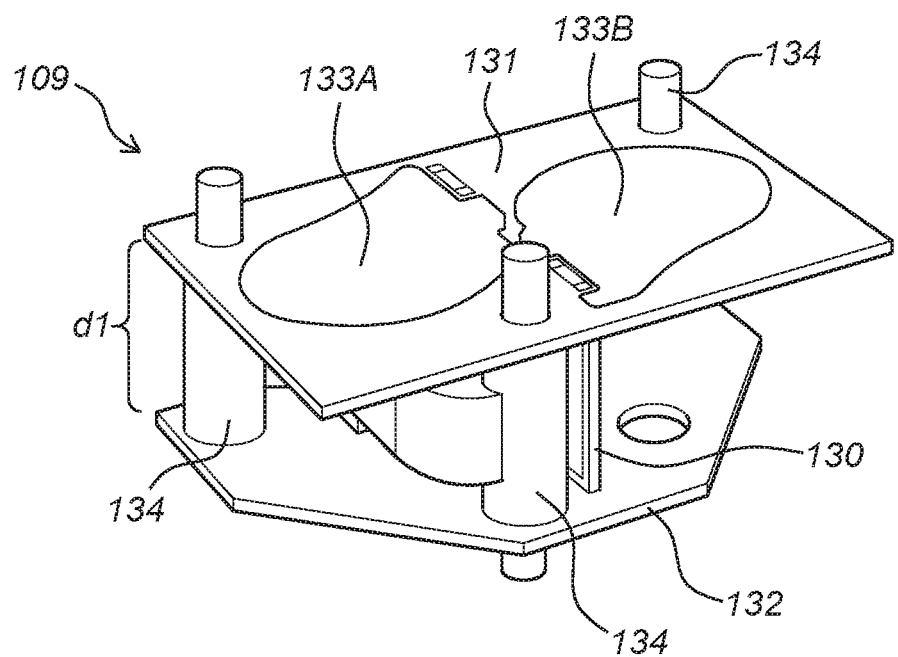
Figure 13B:
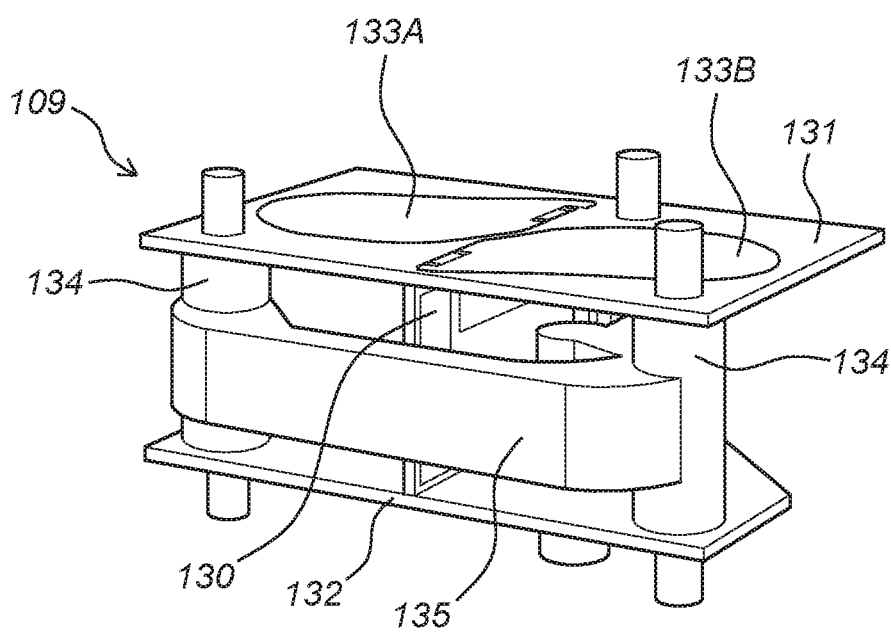
Figure 14:
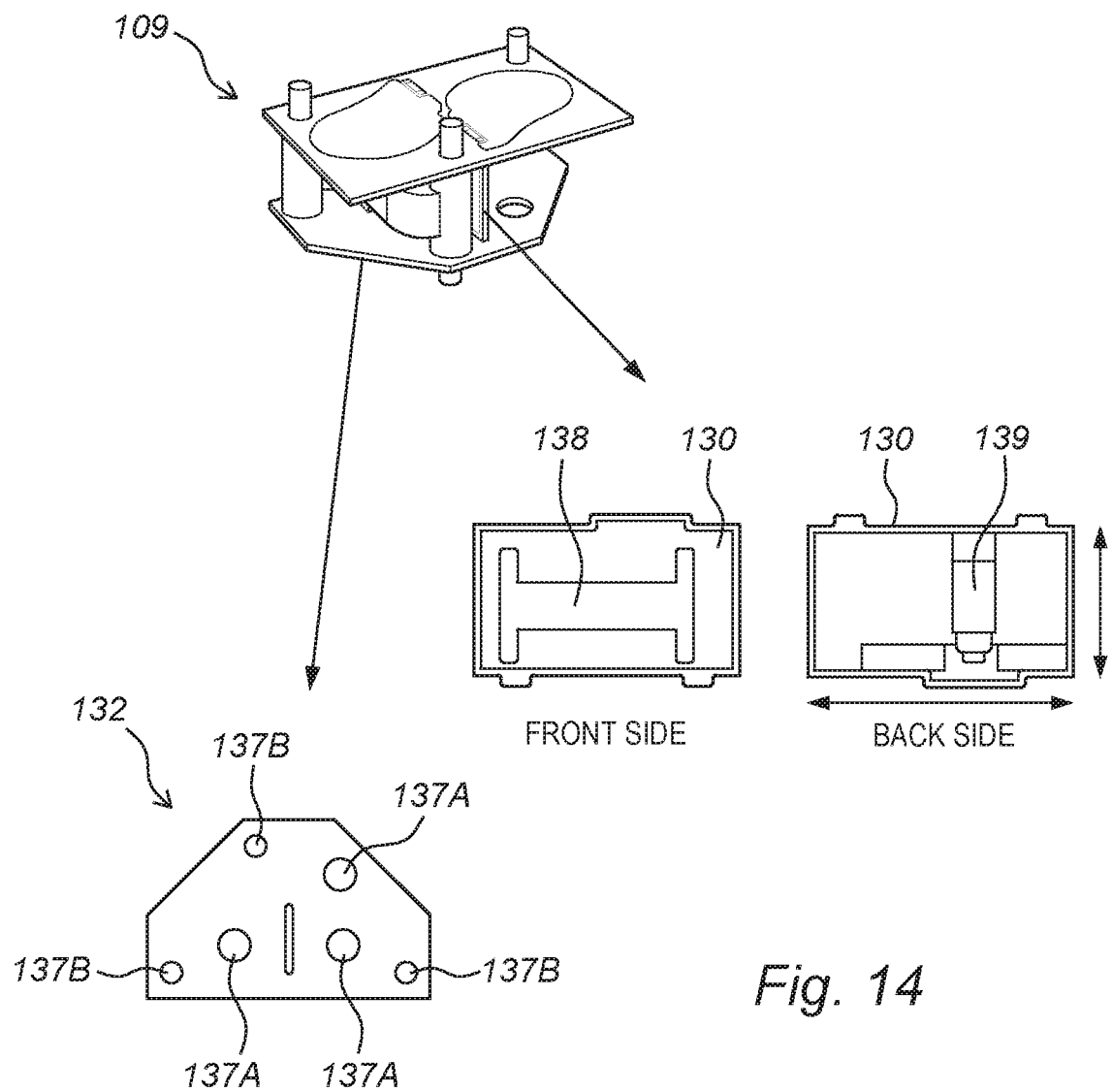

FIGS. 2a-c show schematic representations of an EBG structure according to the invention;

FIGS. 3a and 3b show schematic representations of further embodiment of an antenna device according to the invention;

FIG. 4 shows a schematic representation of a possible single supershape structure of an EBG component according to the invention;

FIG. 5 shows a schematic representation of a possible dual supershape structure of an EBG component according to the invention;

FIG. 6 shows a schematic representation of a single supershape structure of an EBG component according to the invention;

FIGS. 7a-h show a plurality of examples of possible shapes of base profiles of conductive patches of EBG components according to the invention;

FIG. 8 shows a schematic representation of a supershaped EBG component;

FIGS. 9a-h show a plurality of examples of possible supershapes of EBG components according to the invention;

FIG. 10 shows a schematic representation of a supershaped EBG component comprising two independent supershaped structures according to the invention;

FIG. 11 shows a perspective view of a supershaped structure as shown in FIG. 10;

FIGS. 12a-c show the measurement set-up of three different antenna devices, wherein FIG. 12c shows an antenna device according to the invention;

FIG. 12d shows a graph of the isolation enhancement between the antenna devices as shown in FIGS. 12a-c;

FIGS. 13a and 13b show an antenna unit according to the invention, in particular a single-band antenna unit as shown in FIGS. 12a-c; and FIG. 14 shows in more detail the ground plane and the slot antenna of the antenna unit shown in FIG. 13.

Figure 1A:
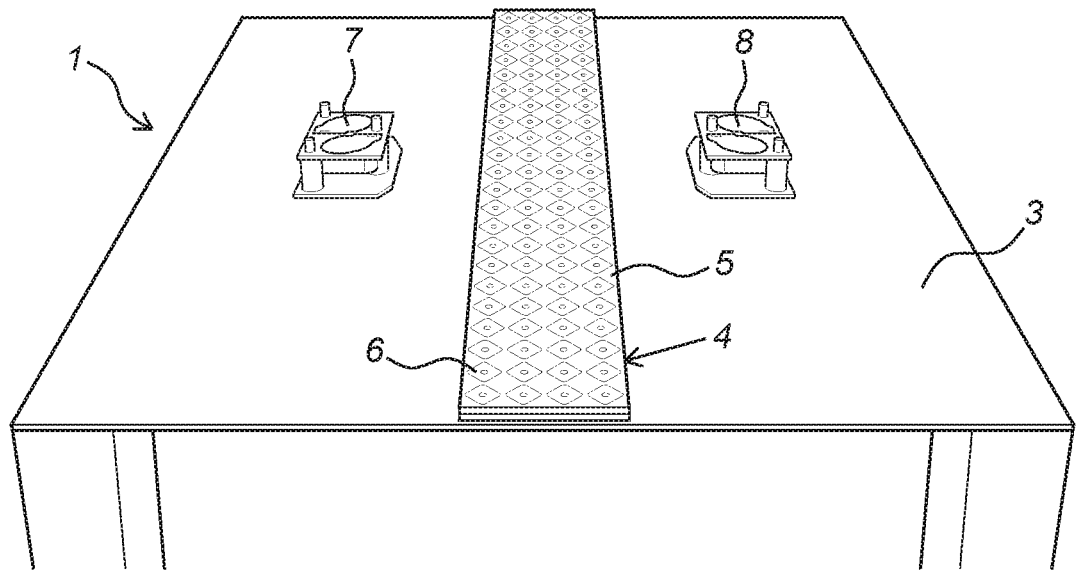
FIG. 1a shows a schematic representation of an antenna device according to the invention.

FIG. 1a shows a schematic representation of an antenna device (1) according to the invention. The antenna device (1) comprises a conductive metal plate (3), also referred to as ground plane (3), and an electromagnetic band gap (EBG) component (4) disposed on said ground plane (3). The assembly of the EBG component (4) and the ground plane (3) is referred to as an EBG structure according to the invention. The EBG component (4) comprises a plurality of conductive tiles (6), arranged according to a periodic pattern and separated by small gaps. Tiles (6) positioned on top of each other are mutually connected by means of vias (not shown), by means of which the tiles (6) are connected to the ground plane (3). The EGB component (4) comprises at least one dielectric layer (5) disposed on said ground plane (3) and a plurality of conductive tiles (6) disposed on the dielectric layer (5) and electrically connected to the shared ground plane (3). The conductive tiles (6) have a base profile defined by the polar function of the Gielis' Formula. More detailed sketches of the EBG structure (4) are shown in FIGS. 2a-c. The antenna device (1) furthermore comprises a plurality of antenna units (7, 8). In the shown embodiment, the antenna device (1) comprises a first antenna unit (7) and a second antenna unit (8). The metal plate (3) of the antenna device (1) serves as a ground plane (3) for said plurality of antenna units (7,8). In the shown configuration, the EBG component (4) is positioned in between two antenna units (7, 8). The EBG component (4) functions as an additional coupling path between the two antennas (7, 8). The presence of the EBG component (4) increases the isolation between the first antenna unit (7) and the second antenna unit (8) without compromising efficiency, gain and radiation pattern characteristics of the antennas (7, 8).

Figure 1B:
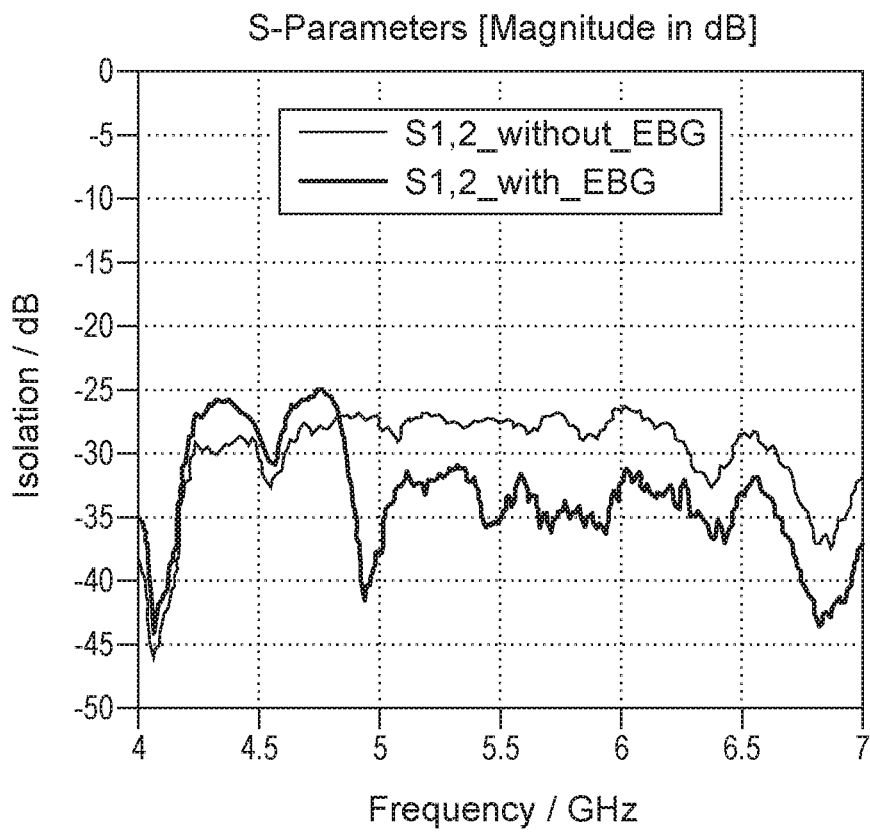

FIG. 1b shows a graph of the isolation enhancement between an antenna device (1) which makes use of an EBG component (4), as shown in FIG. 1b, and an antenna device without an EBG component. The x-axis shows the frequency (in GHz) and the y-axis shows the isolation value (in dB). FIG. 1b shows that the EBG component according to the invention can improve isolation by 10 to 20 dB as compared to systems without an EBG component. This is achieved by tiling a laminate using supershaped conductive tiles based on the Gielis Formula, which laminate is shown in more details in FIGS. 2a-2c.

FIGS. 2a-c show schematic representations of the EBG component (4) as shown in FIG. 1a. Corresponding reference signs therefore correspond to similar units. The EGB component (4) comprises a first dielectric layer (5A) and a second dielectric layer (5B). The first dielectric layer (5A) and the second dielectric layer (5B) are disposed on top of each other, and form a laminate together. Both dielectric layers (5A, 5B) comprise a plurality of conductive tiles (6A, 6B). The tiles (6A, 6B) of each dielectric layer (5A, 5B) have a base profile defined by the Gielis' formula, resulting in a supershaped profile. In the shown embodiment, the tiles (6A) of the first dielectric layer (5A) are arranged in a periodic pattern. The tiles (6B) of the second dielectric layer (5B) are arranged according to substantially the same pattern as the periodic pattern of the first dielectric layer (5A). The conductive tiles (6A, 6B) on both dielectric layers (5A, 5B) can both be physically connected to the ground plane (not shown) by the same via conductor (9). The EBG component (4) comprises a plurality of via conductors (9), wherein each via conductor (9) is enclosed by a through-hole (10) made in each dielectric layer (5A, 5B). Reference number 5" of FIG. 2c indicates the stacked dielectric layers (5A, 5B).

FIGS. 3a and 3b show a schematic representation of another possible embodiment of an antenna device (11) according to the invention. FIG. 3a shows a perspective view, whereas FIG. 3b shows a top view. The antenna device (11) comprises a (shared) ground plane (13) and a plurality of EBG components (14A, 14B) disposed on the ground plane (13). The EBG components (14A, 14B) each comprises a plurality of dielectric layers, and a plurality of conductive tiles disposed on each dielectric layer and electromagnetically coupled to the shared ground plane (13). Stacked tiles are connected by means of vias, wherein each via is also connected to the ground plane (13). The antenna device (11) comprises a first EBG structure (14A) and a second EBG structure (14B). Both the first and the second EBG structures (14A, 14B) are substantially similar to the EBG structure shown in FIGS. 2a-c. The antenna device (11) furthermore comprises a plurality of dual-band antenna units (17A, 17B, 17C, 18A, 18B, 18C). Each dual-band antenna unit (17A, 17B, 17C, 18A, 8B, 8C) is configured to operate in various regions of the electromagnetic spectrum, such as for example the Wi-Fi bands (2.4 GHz/5 GHz). The antenna device (11) also comprises a plurality of single-band antenna units (19A, 19B, 19C, 19D). Each single-band antenna unit (19A, 19B, 19C, 19D) is configured to operate for example at 5 GHz. The arrangement of the single-band antenna units (19A, 19B, 19C, 19D) is a non-limitative example of a possible arrangement of the antenna units. A more detailed description of this dual-band antenna unit (19A, 19B, 19C, 19D) is provided in the non-prepublished Dutch patent applications NL2019365 and NL2019798, the subject-matter of which patent applications is hereby incorporated by reference.

FIG. 4 shows a schematic representation of a possible single supershaped structure of an EBG component (24) according to the invention. The EGB component (24) comprises a first dielectric layer (25A), a second dielectric layer (25B) and a third dielectric layer (25C). The dielectric layers (25A, 25B, 25C) are disposed on top of each other, and form a laminate together. Each dielectric layer (25A, 25B, 25C) comprises a plurality of conductive tiles (26A, 26B, 26C). The tiles (26A, 26B, 26C) of each dielectric layer (25A, 25B, 25C) have a base profile defined by the Gielis' formula. The tiles (26A, 26B, 260) featuring supershaped geometry are also shown isolated from the dielectric layer in this figure. The conductive tiles (26A, 26B, 26C) are physically connected to each other and to the ground plane (23) by a via (29).

FIG. 5 shows a schematic representation of a possible dual complementarily supershaped unit cell of an EBG component (34) according to the invention, and of an EBG structure according to the invention. The figure shows a first supershaped structure (S1) and a second supershaped structure (S2). The EBG component (34) consists of a three layer (35A, 35B, 35C) dielectric laminate structure. The supershapes (S1, S2) are separated from each other by small gaps (30).

FIG. 6 shows a schematic representation of a single supershaped structure of an EBG component (44). The EBG component (44) is a single layer (45) component. The shape of the conductive tiles (46) is defined by the polar function of the Gielis Formula.

FIGS. 7a-h show a plurality of examples of possible shapes of base profiles (20a-h) of conductive tiles of EBG components according to the invention. Each base profile (20a-h) has a different supershape based on the Gielis' formula:

$$\rho_d(\varphi) = \frac{1}{\sqrt[n_1]{\left|\frac{1}{a}\cos\frac{m_1}{4}\varphi\right|^{n_2} + \left/-\left|\frac{1}{b}\sin\frac{m_2}{4}\varphi\right|^{n_3}\right.}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane; and
$\varphi \in [0, 2\pi)$ is the angular coordinate.

Each figure reports the parameter values used in the Gielis' formula to create the shown supershape. The parameter m determines the number of pseudo-vertices of the supershaped base profile (20a-h). The parameters n1, n2 and n3 determine the convexity/concavity characteristics of the supershaped curve. The parameters a and b are fixed in the shown examples and determine the area of the curve.

FIG. 8 shows a schematic representation of a supershaped EBG component. The figure shows a unit cell (80). The unit cell (80) is a supershaped structure that repeats itself infinitely with a repetition factor dx and dy. A perspective view of one isolated unit cell (80) is shown. The unit cell (80) comprises at least one conductive tile (86). The figures show that the conductive layer (86) can comprise a first supershaped tile (S1) or a second supershaped tile (S2). The second supershaped structure (S2) is complementary to the first supershaped structure (S1). This results in that the unit structure comprises two dependent supershapes. The dielectric substrate layer (85) is only shown in the first perspective view and is made invisible in the second perspective view. The supershapes (S1, S2) are separated by a gap (G). Each conductive tile (86) is physically connected to the ground plane (83) by an individual via (89). The thickness of the substrate (85) is for example 3 mm, the material can be FR4 (relative permittivity=4.3, tan delta 0.025), the diameter of the via (89) is for example 0.9 mm, and the gap is for example 0.26 mm. The supershape of the tiles in FIG. 8 are based on the Gielis' formula, using the following parameters: a=b=2.44 mm, m=8, n1=n2=n3=5.

FIGS. 9a-h show a plurality of examples of possible complementary supershapes of EBG components according to the invention. The supershapes are created by changing only a single parameter (m) in contrast to the supershapes shown in FIG. 8. All FIGS. 9a-h show a structure which comprises two dependent complementary supershapes (S1, S2).

FIG. 10 shows a schematic representation of a supershaped EBG structure comprising two independent supershaped tiles (S1 and S2). The independent supershapes (S1, S2) are separated by each other via a gap (G).

The Gielis equation parameters for obtaining the first tile (S1) as shown in this figure are: a=b=1, m=4, n1=2.1 and n2=n3=9.

The Gielis equation parameters for obtaining the second tile (S2) as shown in this figure are: a=b=2.26, m=4, n1=10 and n2=n3=11. The dimension of a and b is typically related to the ratio of n1 to n2=n3.

FIG. 11 shows a perspective view of a supershaped structure as shown in FIG. 10, comprising two independent supershapes (S1, S2). Each supershaped tile is electrically connected to a ground plate by means of a via (119).

FIGS. 12a-c show the measurement set-up of three different antenna devices. The first antenna device (101) (FIG. 12a) shows an antenna device without an EBG component. The second antenna device (201) (FIG. 12b) shows an antenna device with two square-shaped EBG components (204). These are conventional EBG components, which do not comprise a supershape. The third antenna device (301) (FIG. 12c) shows an antenna device (301) with two EBG components (304) comprising a supershaped structure. Each antenna device (101, 201, 301) comprises a plurality of dual-band antenna units (107A, 107B, 108A, 108B, 108C, 207A, 207B, 208A, 208B, 208C, 307A, 307B, 308A, 308B, 308C). Each dual-band antenna unit (107A, 107B, 108A, 108B, 108C, 207A, 207B, 208A, 208B, 208C, 307A, 307B, 308A, 308B, 308C) is configured to operate in various regions of the electromagnetic spectrum, such as for example Wi-Fi bands (2.4 GHz/5 GHz). Each antenna device (101, 201, 301) also comprises a plurality of single-band antenna units (109A, 109B, 109C, 109D, 209A, 209B, 209C, 209D, 309A, 309B, 309C, 309D). Each single-band antenna units (109A, 109B, 109C, 1090, 209A, 209B, 209C, 209D, 309A, 309B, 309C, 309D) is configured to operate for example at 5 GHz. Each antenna device (101, 201, 301) comprises a conductive, metal ground plane (103, 203, 303). The EGB components (204, 304) are optimized to cover the 5.15 GHz-5.875 GHz frequency range. The EBG components of the second antenna device (201) and the third antenna device (301) are realized on the same substrate material. The dimensions of the EBG components (204, 304) are equal.

FIG. 12*d* shows a graph of the isolation enhancement when comparing the first antenna device (101), to the second antenna device (201), to the third antenna device (301), as shown in FIGS. 12*a-c*. The x-axis of the graph shows the frequency (in GHz) and the y-axis shows the isolation value (in dB). FIG. 12*d* shows that using a conventional EBG component (204) already can improve isolation by about 5 dB as compared to the antenna system without an EBG component. The graph further shows that by using a super-shaped EBG component (304) the isolation can be further improved by additional 5-10 dB, at least.

FIGS. 13*a* and 13*b* show an antenna unit (109) according to the invention, in particular a single-band antenna unit as shown in FIGS. 12*a-c*. This is referred to 109A, 109B, 109C, 109D, 209A, 209B, 209C, 209D, 309A, 309B, 309C and 309D.

FIGS. 13*a* and 13*b* show a different perspective view of the antenna unit (109). The antenna unit (109) is a dual-port antenna, comprising a slot antenna (130) and a dipole antenna (131). The single-band antenna (109) is configured to operate for example at 5 GHz. In the shown embodiment, both the slot antenna (130) and the dipole antenna (131) are configured to operate in the Wi-Fi band at 5 GHz. The slot antenna (130) is mounted on a conductive ground plane (132). The ground plane (132) is shown in more detail in FIG. 14. The dipole antenna (131) comprises a PCB and is placed at a predefined distance (d1) from the ground plane (132). This distance is preferably relatively small, for example between 5 and 10 mm. Between the ground plane (132) and the dipole antenna (131) a distance holder (134) is present. In the shown embodiment, the distance holder (134) comprises a reinforcement rib (135). The distance holder (134) and/or reinforcement rib (135) can for example be made out of plastic. The dipole antenna (131) comprises two flares (133A, 133B). The shape of the conductive flares (133A, 133B) is defined by the polar function of the Gielis' formula:

$$\rho_d(\varphi) = \frac{1}{\sqrt[n_1]{\left|\frac{1}{a}\cos\frac{m_1}{4}\varphi\right|^{n_2} + \left/ -\left|\frac{1}{b}\sin\frac{m_2}{4}\varphi\right|^{n_3}\right.}}$$

$$a, b \in \mathbb{R}^+; m_1, m_2, n_1, n_2, n_3 \in \mathbb{R}, a, b, n_1 \neq 0$$

Where the x-dimension of the flare is scaled by a factor $K_1$ according to:

$$X_d(\varphi) = K_1 \rho_d(\varphi)\cos(\theta)$$

and the y-dimension of the flare is scaled by a factor $K_2$ according to:

$$Y_d(\varphi) = K_2 \rho_d(\varphi)\sin(\theta)$$

The optimized parameters for the dipole flares as shown in the figure are $K_1$=5.3 mm, $K_2$=4.2 mm, a=b=1, m=1, n1=18 and n2=n3=2.2. Possibly the parameters for the dipole flares can be chosen within the following ranges: $K_1$=5.3-5.4, $K_2$=4.2-5.2, a=b=1, m=1.2, n1=15-50, n2=n3=2.2-5.

The flares (133A, 133B) are not in contact with each other. The distance between the flares (133A, 133B) is preferably about 0.3 mm. The slot antenna (130) is mounted perpendicular to the dipole antenna (131). Each flare (133A, 133B) is positioned at a different side of the slot antenna (130) (as seen from a top view). The slot antenna (130) is shown in more detail in FIG. 14. The antenna unit (109) according to the invention features good isolation characteristics. Furthermore, the antenna unit (109) according to the invention features well behaved radiation patterns. Another benefit is that the antenna unit according to the invention is relatively easy to manufacture. Experiments show that the isolation between two ports, where the first port is connected to the dipole antenna (131) and the second port is connected to the slot antenna (130), is about 28 dB in the 5.15-5.875 GHz frequency range. This results in a total measured antenna efficiency for the first port between 75 and 80% and a total measured antenna efficiency for the second port between 64 and 75%. The measured efficiency accounts for the losses of a 15 cm long 1.32 mm thick coaxial cable. The peak realized gain for the first port is between 5.4 dBi and 5.8 dBi. The peak realized gain for the second port is between 4.4 dBi and 5.5 dBi.

FIG. 14 shows the antenna unit (109) of FIG. 13, and in more detail the ground plane (132) and the slot antenna (130). The ground plane (132) is a conductive metal plate (132). The ground plane (132) is for example manufactured from metal or stainless steel. The ground plane (132) comprises holes (137A) for positioning the antenna unit (109) on an antenna device according to the invention, in particular to the ground plane of such antenna device, via mechanical securing. The ground plane (132) furthermore comprises holes (137B) for enabling mounting the distance holder. The slot antenna (130) comprises a PCB which comprises a radiating slot (138). The radiating slot (138) is shown in the front side of the slot antenna (130). The radiating slot (138) has a Roman I-shaped configuration. Obviously, other slot configurations are also possible. For example, an H-shaped radiating slot. The back side of the slot antenna (130) comprises a feeding pin (139). A RF feeding cable can be connected to the feeding pin (139).

In a possible embodiment, the antenna unit can be modified such that it is configured to operate at both 5 GHz and 2.4 GHz. The dipole antenna (131) can for example operate at 2.4 GHz and the slot antenna (130) can operate at 5 GHz, or vice versa.

It will be apparent that the invention is not limited to the working examples shown and described herein, but that numerous variants are possible within the scope of the attached claims that will be obvious to a person skilled in the art.

The above-described inventive concepts are illustrated by several illustrative embodiments. It is conceivable that individual inventive concepts may be applied without, in so doing, also applying other details of the described example. It is not necessary to elaborate on examples of all conceivable combinations of the above-described inventive concepts, as a person skilled in the art will understand numerous inventive concepts can be (re)combined in order to arrive at a specific application.

The verb "comprise" and conjugations thereof used in this patent publication are understood to mean not only "comprise", but are also understood to mean the phrases "contain", "substantially consist of", "formed by" and conjugations thereof.

The invention claimed is:

1. An Electromagnetic Band Gap (EBG) structure comprising:
   a conductive ground plane;
   at least one dielectric layer disposed on said ground plane; and
   a plurality of conductive tiles disposed on the at least one dielectric layer and electrically connected to the conductive ground plane, wherein at least a number of the conductive tiles have a base profile defined by the polar function:

$$\rho_d(\varphi) = \frac{1}{\sqrt[n_1]{\left|\frac{1}{a}\cos\frac{m_1}{4}\varphi\right|^{n_2} + \Big/ - \left|\frac{1}{b}\sin\frac{m_2}{4}\varphi\right|^{n_3}}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane, and
$\varphi \in [0, 2\pi)$ is the angular coordinate, and
wherein the conductive ground plane and/or the at least one dielectric layer has a base profile also defined by $\rho_d(\varphi)$.

2. The EBG structure according to claim 1, wherein all tiles have a base profile defined by the polar function:

$$\rho_d(\varphi) = \frac{1}{\sqrt[n_1]{\left|\frac{1}{a}\cos\frac{m_1}{4}\varphi\right|^{n_2} + \Big/ - \left|\frac{1}{b}\sin\frac{m_2}{4}\varphi\right|^{n_3}}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane; and
$\varphi \in [0, 2\pi)$ is the angular coordinate.

3. The EBG structure according to claim 1, wherein the EBG structure comprises a plurality of differently shaped conductive tiles disposed on each dielectric layer and electrically connected to the ground plane, wherein preferably all tiles have a base profile defined by the polar function:

$$\rho_d(\varphi) = \frac{1}{\sqrt[n_1]{\left|\frac{1}{a}\cos\frac{m_1}{4}\varphi\right|^{n_2} + \Big/ - \left|\frac{1}{b}\sin\frac{m_2}{4}\varphi\right|^{n_3}}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane; and
$\varphi - [0, 2\pi)$ is the angular coordinate.

4. The EBG structure according to claim 3, wherein the base profiles of at least two differently shaped tiles have an at least partially complementary shape.

5. The EBG structure according to claim 1, wherein the conductive tiles disposed on each said dielectric layer are arranged in a pattern.

6. The EBG structure according to claim 1, wherein the tiles disposed on each dielectric layer are arranged at a distance from each other.

7. The EBG structure according to claim 1, wherein at least a number of tiles have a substantially flat (2D) geometry.

8. The EBG structure according to claim 1, wherein each tile is physically connected to the ground plane by a conductive via enclosed by a through-hole made in at least one dielectric layer.

9. The EBG structure according to claim 1, wherein the EBG structure comprises a plurality of dielectric layers stacked or disposed on top of each other, wherein a plurality of conductive tiles is disposed on each dielectric layer.

10. The EBG structure according to claim 1, wherein a plurality of tiles disposed on different dielectric layers are physically connected to the ground plane by the same via enclosed by a through-hole made in each dielectric layer.

11. The EBG structure according to claim 1, wherein a≠b.

12. The EBG structure according to claim 1, wherein at least one value of $n_1$, $n_2$, and $n_3$ deviates from 2.

13. The EBG structure according claim 1, wherein the parametric representation of the three-dimensional shape of at least a number of tiles, in particular tiles disposed on an upper dielectric layer, is based on two perpendicular cross sections $\rho_1(\varepsilon)$ and $\rho_2(\varphi)$:

$$\begin{bmatrix} x = \rho_1(\vartheta)\cos\vartheta \cdot \rho_2(\varphi)\cos\varphi \\ y = \rho_1(\vartheta)\sin\vartheta \cdot \rho_2(\varphi)\cos\varphi \\ z = \rho_2(\varphi)\sin\varphi \end{bmatrix}$$

wherein:
$\rho$ is defined by the function according to claim 1,
$0 \leq \varepsilon \leq 2\pi$, and
$-\frac{1}{2}\pi \leq \varphi \leq \frac{1}{2}\pi$.

14. The EBG structure according to claim 1, wherein the ground plane is larger than the at least one dielectric layer.

15. The EBG structure according to claim 1, wherein the EBG structure comprises:
   a shared ground plane, and a plurality of distant EBG components disposed on said shared ground plane, wherein each EBG component comprises:
      at least one dielectric layer, and
      a plurality of conductive tiles disposed on each dielectric layer and electromagnetically coupled to the shared ground plane,
wherein at least a number of tiles has a base profile defined by the polar function:

$$\rho_d(\varphi) = \frac{1}{\sqrt[n_1]{\left|\frac{1}{a}\cos\frac{m_1}{4}\varphi\right|^{n_2} + \Big/ - \left|\frac{1}{b}\sin\frac{m_2}{4}\varphi\right|^{n_3}}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane; and
$\varphi \in [0, 2\pi)$ is the angular coordinate.

16. The EBG structure according to claim 5, wherein the conductive tiles disposed on each of the dielectric layers are arranged in a periodic pattern.

17. An EBG component for use in a EBG structure according to claim 1, said component comprising at least one dielectric layer configured to be disposed on the conductive ground plane of the EBG structure; and
a plurality of conductive patches disposed on each dielectric layer and configured to be electromagnetically coupled to the ground plane, wherein at least a number of patches has a base profile defined by the polar function:

$$\rho_d(\varphi) = \cfrac{1}{\sqrt[n_1]{\left|\cfrac{1}{a}\cos\cfrac{m_1}{4}\varphi\right|^{n_2} + \left/\,-\left|\cfrac{1}{b}\sin\cfrac{m_2}{4}\varphi\right|^{n_3}\right.}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane; and
$\varphi \in [0, 2\pi)$ is the angular coordinate.

18. An antenna device comprising:
at least one EBG structure according to claim 1;
at least one EBG component disposed on said conductive ground plane of the at least one EBG structure, wherein each EBG component comprises:
at least one dielectric layer, and
a plurality of conductive tiles disposed on each dielectric layer and electrically connected to the shared ground plane, wherein at least a number of tiles has a base profile defined by the polar function:

$$\rho_d(\varphi) = \cfrac{1}{\sqrt[n_1]{\left|\cfrac{1}{a}\cos\cfrac{m_1}{4}\varphi\right|^{n_2} + \left/\,-\left|\cfrac{1}{b}\sin\cfrac{m_2}{4}\varphi\right|^{n_3}\right.}}$$

$a, b \in \mathbb{R}^+; m_1, m_2, n_1, n_2, n_3 \in \mathbb{R}, a, b, n_1 \neq 0$ wherein:
$\rho_d(\varphi)$ is a curve located in the XY-plane; and
$\varphi \in [0, 2\pi)$ is the angular coordinate; and
a plurality of antenna units,
wherein the conductive ground plane of the EBG structure serves as a ground plane for said plurality of antenna units, and wherein the at least one EBG component is positioned in between two antenna units.

19. The antenna device according to claim 18, wherein the EBG structure comprises a plurality of EBG components sharing the same ground plane, wherein the shared ground plane of the EBG components serves a ground plane for said plurality of antenna units.

* * * * *

UNITED STATES PATENT AND TRADEMARK OFFICE
CERTIFICATE OF CORRECTION

Page 1 of 1

PATENT NO. : 10,985,455 B2
APPLICATION NO. : 16/608076
DATED : April 20, 2021
INVENTOR(S) : Shady Keyrouz et al.

It is certified that error appears in the above-identified patent and that said Letters Patent is hereby corrected as shown below:

In the Claims

Claim 13, Column 14, Line 26:
Please delete "sections $\rho_1(\varepsilon)$ and $\rho_2(\varphi)$" and replace with "sections $\rho_1(\vartheta)$ and $\rho_2(\varphi)$"

Claim 13, Column 14, Line 37:
Please delete "$0 \leq \varepsilon \leq 2\pi$, and" and replace with "$0 \leq \vartheta \leq 2\pi$, and"

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*